(12) United States Patent
Wang

(10) Patent No.: US 10,140,209 B2
(45) Date of Patent: Nov. 27, 2018

(54) TIME DE-INTERLEAVING CIRCUIT AND TIME DE-INTERLEAVING METHOD FOR REDUCING A NUMBER OF TIMES OF ACCESSING MEMORY

(71) Applicant: MStar Semiconductor, Inc., Hsinchu Hsien (TW)

(72) Inventor: Chun-Chieh Wang, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 116 days.

(21) Appl. No.: 15/083,499

(22) Filed: Mar. 29, 2016

(65) Prior Publication Data

US 2016/0292073 A1 Oct. 6, 2016

(30) Foreign Application Priority Data

Mar. 31, 2015 (TW) .............................. 104110477 A

(51) Int. Cl.
G06F 12/06 (2006.01)
H03M 13/05 (2006.01)
(Continued)

(52) U.S. Cl.
CPC ........ *G06F 12/0607* (2013.01); *G06F 3/0613* (2013.01); *G06F 3/0656* (2013.01); *G06F 3/0673* (2013.01); *H03M 13/276* (2013.01); *H03M 13/2778* (2013.01); *H03M 13/2782* (2013.01); *G06F 2212/1021* (2013.01);
(Continued)

(58) Field of Classification Search
CPC .. G06F 12/0607; G06F 3/0613; G06F 3/0656; G06F 3/0673; G06F 2212/1021; G06F 2212/1056; G06F 2212/174; H03M 13/05; H03M 13/1102; H03M 13/1165; H03M 13/255; H03M 13/27; H03M 13/2707; H03M 13/2757; H03M 13/276; H03M 13/2778; H03M 13/2782; H03M 13/2785; H03M 13/6502; H03M 13/6505; H03M 13/6552
See application file for complete search history.

(56) References Cited

U.S. PATENT DOCUMENTS 6,687,870 B1 2/2004 Mohseni et al.
2006/0069979 A1 3/2006 Wu et al.
(Continued)

FOREIGN PATENT DOCUMENTS

WO 2000004645 A1 1/2000

OTHER PUBLICATIONS

Taiwan Office Action, dated Mar. 22, 2016, 9 pages.

*Primary Examiner* — Albert Decady
*Assistant Examiner* — Christian M Dorman
(74) *Attorney, Agent, or Firm* — Edell, Shapiro & Finnan, LLC

(57) ABSTRACT

A time de-interleaving circuit applied to a communication system to de-interleave an interleaved signal is provided. The interleaved signal includes a plurality of cells. The time de-interleaving circuit includes a memory module and a buffering memory module. The memory module stores the cells, which are in a unit of a plurality of cells to form a plurality of cell groups. The memory module is accessed in a unit of one cell group. The buffering memory module buffers a part of the cells from the memory module to arrange an output sequence of the cells.

8 Claims, 28 Drawing Sheets

(51) Int. Cl.
  *H03M 13/00*    (2006.01)
  *G06F 3/06*     (2006.01)
  *H03M 13/27*    (2006.01)
  *H03M 13/11*    (2006.01)
  *H03M 13/25*    (2006.01)

(52) U.S. Cl.
  CPC ............... *G06F 2212/1056* (2013.01); *G06F 2212/174* (2013.01); *H03M 13/1165* (2013.01); *H03M 13/255* (2013.01)

(56) References Cited

U.S. PATENT DOCUMENTS

| | | | |
|---|---|---|---|
| 2010/0245677 A1* | 9/2010 | Yokokawa ............. | H03M 13/11 348/725 |
| 2010/0283912 A1* | 11/2010 | Sun ....................... | H04L 1/0071 348/726 |
| 2013/0132705 A1 | 5/2013 | Ishii | |
| 2015/0106577 A1* | 4/2015 | Rajamani ............ | G06F 13/1647 711/157 |

* cited by examiner

| 0 | 20 | 40 | 60 | 80 | 100 | 120 | 140 |
|---|----|----|----|----|-----|-----|-----|
| 1 | 21 | 41 | 61 | 81 | 101 | 121 | 141 |
| 2 | 22 | 42 | 62 | 82 | 102 | 122 | 142 |
| 3 | 23 | 43 | 63 | 83 | 103 | 123 | 143 |
| 4 | 24 | 44 | 64 | 84 | 104 | 124 | 144 |
| 5 | 25 | 45 | 65 | 85 | 105 | 125 | 145 |
| 6 | 26 | 46 | 66 | 86 | 106 | 126 | 146 |
| 7 | 27 | 47 | 67 | 87 | 107 | 127 | 147 |
| 8 | 28 | 48 | 68 | 88 | 108 | 128 | 148 |
| 9 | 29 | 49 | 69 | 89 | 109 | 129 | 149 |
| 10 | 30 | 50 | 70 | 90 | 110 | 130 | 150 |
| 11 | 31 | 51 | 71 | 91 | 111 | 131 | 151 |
| 12 | 32 | 52 | 72 | 92 | 112 | 132 | 152 |
| 13 | 33 | 53 | 73 | 93 | 113 | 133 | 153 |
| 14 | 34 | 54 | 74 | 94 | 114 | 134 | 154 |
| 15 | 35 | 55 | 75 | 95 | 115 | 135 | 155 |
| 16 | 36 | 56 | 76 | 96 | 116 | 136 | 156 |
| 17 | 37 | 57 | 77 | 97 | 117 | 137 | 157 |
| 18 | 38 | 58 | 78 | 98 | 118 | 138 | 158 |
| 19 | 39 | 59 | 79 | 99 | 119 | 139 | 159 |

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

| LDPC block length ($N_{ldpc}$) | modulation mode | Nr | maximum value of Nc | size of memory 714 (circular, bytes) | size of memory 721 (bits) | | |
|---|---|---|---|---|---|---|---|
| | | | | | w/c=2 | w/c=4 | w/c=8 |
| 64800 | 256QAM | 1,620 | 340 | 4,406,400 | 51,840 | 155,520 | 362,880 |
| | 64QAM | 2,160 | 255 | 4,423,680 | 69,120 | 207,360 | 483,840 |
| | 16QAM | 3,240 | 170 | 4,406,400 | 103,680 | 311,040 | 725,760 |
| | QPSK | 6,480 | 85 | 4,458,240 | 207,360 | 622,080 | 1,451,520 |
| 16200 | 256QAM | 405 | 1,375 | 4,458,240 | 12,960 | 38,880 | 90,720 |
| | 64QAM | 540 | 1,030 | 4,449,600 | 17,280 | 51,840 | 120,960 |
| | 16QAM | 810 | 685 | 4,445,280 | 25,920 | 77,760 | 181,440 |
| | QPSK | 1,620 | 340 | 4,406,400 | 51,840 | 155,520 | 362,880 |

FIG. 12a

| LDPC block length ($N_{ldpc}$) | modulation mode | Nr | maximum value of Nc | number of times of accessing memory 714 and ratio | | | | | | | | |
|---|---|---|---|---|---|---|---|---|---|---|---|---|
| | | | | w/c=2 | | | w/c=4 | | | w/c=8 | | |
| | | | | prior art | present invention | ratio | prior art | present invention | ratio | prior art | present invention | ratio |
| 64800 | 256QAM | 1,620 | 340 | 826,200 | 550,800 | 66.67% | 688,500 | 275,400 | 40.00% | 620,460 | 139,320 | 22.45% |
| | 64QAM | 2,160 | 255 | 827,280 | 552,960 | 66.84% | 689,040 | 276,480 | 40.13% | 619,920 | 138,240 | 22.30% |
| | 16QAM | 3,240 | 170 | 826,200 | 550,800 | 66.67% | 690,120 | 278,640 | 40.38% | 622,080 | 142,560 | 22.92% |
| | QPSK | 6,480 | 85 | 829,440 | 557,280 | 67.19% | 693,360 | 285,120 | 41.12% | 622,080 | 142,560 | 22.92% |
| 16200 | 256QAM | 405 | 1,375 | 835,515 | 557,280 | 66.70% | 696,195 | 278,640 | 40.02% | 626,535 | 139,320 | 22.24% |
| | 64QAM | 540 | 1,030 | 834,300 | 556,200 | 66.67% | 695,520 | 278,640 | 40.06% | 625,860 | 139,320 | 22.26% |
| | 16QAM | 810 | 685 | 832,680 | 555,660 | 66.73% | 694,170 | 278,640 | 40.14% | 624,510 | 139,320 | 22.31% |
| | QPSK | 1,620 | 340 | 826,200 | 550,800 | 66.67% | 688,500 | 275,400 | 40.00% | 620,460 | 139,320 | 22.45% |

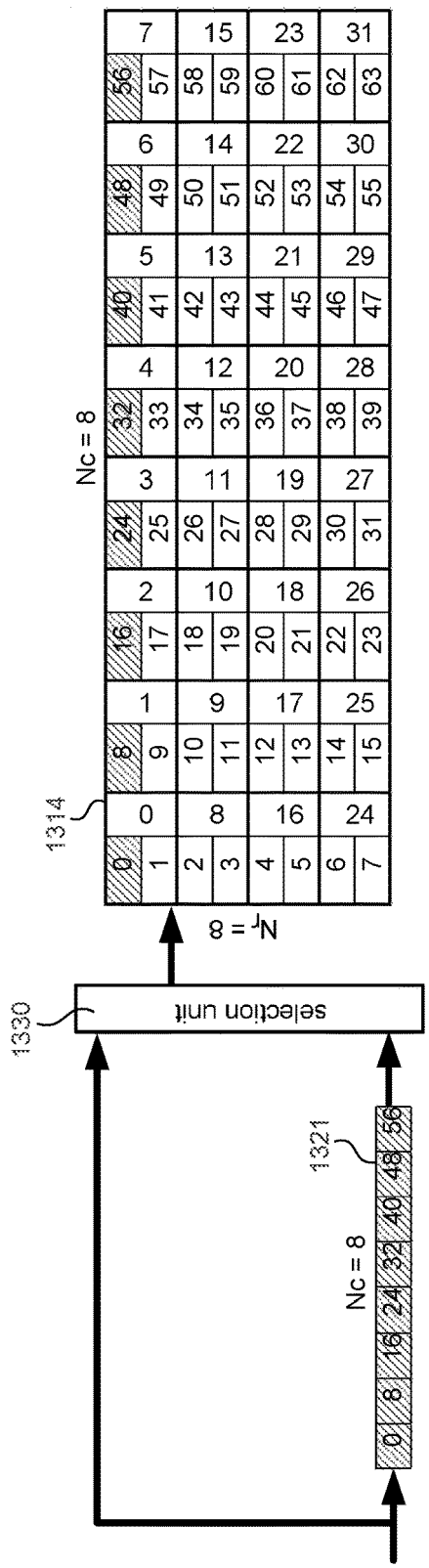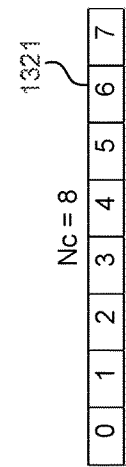
FIG. 16a
FIG. 16b

| LDPC block length ($N_{ldpc}$) | modulation mode | Nr | maximum value of Nc | size of memory 1314 (circular, bytes) | size of memory 1321 (bits) | | |
|---|---|---|---|---|---|---|---|
| | | | | | w/c=2 | w/c=4 | w/c=8 |
| 64800 | 256QAM | 1,620 | 340 | 4,406,400 | 10,880 | 32,640 | 76,160 |
| 64800 | 64QAM | 2,160 | 255 | 4,423,680 | 8,160 | 24,480 | 57,120 |
| 64800 | 16QAM | 3,240 | 170 | 4,406,400 | 5,440 | 16,320 | 38,080 |
| 64800 | QPSK | 6,480 | 85 | 4,458,240 | 2,720 | 8,160 | 19,040 |
| 16200 | 256QAM | 405 | 1,375 | 4,458,240 | 44,000 | 132,000 | 308,000 |
| 16200 | 64QAM | 540 | 1,030 | 4,449,600 | 32,960 | 98,880 | 230,720 |
| 16200 | 16QAM | 810 | 685 | 4,445,280 | 21,920 | 65,760 | 153,440 |
| 16200 | QPSK | 1,620 | 340 | 4,406,400 | 10,880 | 32,640 | 76,160 |

FIG. 18b

| LDPC block length ($N_{ldpc}$) | modulation mode | Nr | maximum value of Nc | number of times of accessing memory 1314 and ratio | | | | | | | | |
|---|---|---|---|---|---|---|---|---|---|---|---|---|
| | | | | w/c=2 | | | w/c=4 | | | w/c=8 | | |
| | | | | prior art | present invention | ratio | prior art | present invention | ratio | prior art | present invention | ratio |
| 64800 | 256QAM | 1,620 | 340 | 826,200 | 550,800 | 66.67% | 688,500 | 275,400 | 40.00% | 620,460 | 138,040 | 22.25% |
| 64800 | 64QAM | 2,160 | 255 | 827,280 | 550,800 | 66.58% | 689,040 | 275,400 | 39.97% | 619,920 | 137,700 | 22.21% |
| 64800 | 16QAM | 3,240 | 170 | 826,200 | 550,800 | 66.67% | 690,120 | 275,400 | 39.91% | 622,080 | 137,700 | 22.14% |
| 64800 | QPSK | 6,480 | 85 | 829,440 | 550,800 | 66.41% | 693,360 | 275,400 | 39.72% | 622,080 | 137,700 | 22.14% |
| 16200 | 256QAM | 405 | 1,375 | 835,515 | 558,250 | 66.82% | 696,195 | 280,500 | 40.29% | 626,535 | 140,250 | 22.39% |
| 16200 | 64QAM | 540 | 1,030 | 834,300 | 556,200 | 66.67% | 695,520 | 278,100 | 39.98% | 625,860 | 140,080 | 22.38% |
| 16200 | 16QAM | 810 | 685 | 832,680 | 554,850 | 66.63% | 694,170 | 278,110 | 40.06% | 624,510 | 139,740 | 22.38% |
| 16200 | QPSK | 1,620 | 340 | 826,200 | 550,800 | 66.67% | 688,500 | 275,400 | 40.00% | 620,460 | 138,040 | 22.25% |

US 10,140,209 B2

TIME DE-INTERLEAVING CIRCUIT AND TIME DE-INTERLEAVING METHOD FOR REDUCING A NUMBER OF TIMES OF ACCESSING MEMORY

This application claims the benefit of Taiwan application Serial No. 104110477, filed Mar. 31, 2015, the subject matter of which is incorporated herein by reference.

BACKGROUND OF THE INVENTION

Field of the Invention

The invention relates in general to a time de-interleaving circuit and method, and more particularly to a time de-interleaving circuit and method capable of reducing the number of times of accessing a system memory.

Description of the Related Art

In general, before a Digital Video Broadcasting—Second Generation Terrestrial (DVB-T2) broadcast signal is transmitted, cell interleaving and time interleaving processes are performed on data to be transmitted to minimize effects that various types of interference has on transmitted data, so that the receiver may obtain correct transmitted data. After the signal is received at the receiver, time de-interleaving and cell de-interleaving processes are performed on the received signal to correctly decode the data. FIG. 1 shows a block diagram of a conventional signal receiver 100. The signal receiver 100 includes a demodulator 110, a frequency de-interleaving circuit 120, a time de-interleaving circuit 130, a cell de-interleaving circuit 140, a de-mapping circuit 150 and a decoding circuit 160. An input signal is a modulated signal (e.g., a quadrature amplitude modulation (QAM) signal based on orthogonal frequency division multiplexing (OFDM)), and is processed by the demodulator 110 to obtain an interleaved signal that includes information of two orthogonal components (I and Q) and a signal-to-noise ratio (SNR). After de-interleaving processes performed by the frequency de-interleaving circuit 120, the time de-interleaving circuit 130 and the cell de-interleaving circuit 140, the data is rearranged in a correct sequence. The processed data is then computed by de-mapping circuit 150 to restore into bit information, which is next processed (e.g., a low-density parity check (LPDC) and BCH decoding) by the decoding circuit 160 to obtain the transmitted data.

The time de-interleaving operation is performed in a unit of one time interleaving (TI) block. Each TI block includes $N_{FEC}$ forward error correction (FEC) blocks, and each FEC block includes $N_{cell}$ cells. Assume that one TI block includes four FEC blocks ($N_{FEC}$=4), and each FEC block includes 40 cells ($N_{cell}$=40). When the transmitter performs time de-interleaving, the size of a dynamic random access memory (DRAM) is set as Nr rows and Nc columns, where Nr is $N_{cell}/5$ (eight in this example) and Nc is $N_{FEC}\times 5$ (20 in this example). FIG. 2a and FIG. 2b are configuration diagrams of a memory conventionally used for time interleaving. The size of the memory is Nr×Nc cells, and the value in each grid represents the sequence of writing/reading into/from (FIG. 2a indicates the sequence of writing and FIG. 2b represents the reading sequence) memory addresses. In this example, the word read/written from/into the memory is equal to the size (e.g., 32 bits) of cells. In the writing operation in FIG. 2a, the cells are written sequentially and vertically from the upper left corner, and a next column is written after a previous column is fully written. In the reading operation in FIG. 2b, the cells are read sequentially and horizontally from the upper left corner, and a next row is read after a previous row is completely read. Assuming that the address sequences for writing in FIG. 2a also represent the numbers of the written cells, the number sequence of the written cells is: 0, 1, 2, 3, ..., 78, 80, ..., 158, and 159, and the number sequence of the read cells is 0, 8, 16, 24, ..., 155, 4, ..., 151 and 159, hence achieving an effect of dispersing the cells.

FIG. 3 shows a block diagram of a time de-interleaving circuit and a cell de-interleaving circuit of a conventional signal receiver. A time de-interleaving circuit 130 includes a DRAM 132, a writing address generator 134 and a reading address generator 136. Through the controls of the writing address generator 134 and the reading address generator 136, the cells written into a TI block is sequentially and vertically written from the upper left corner of the DRAM 132, and a next row is written after a previous is fully written, whereas the cells are sequentially and horizontally read from the upper left corner of the DRAM 132, and a next row is read after a previous row is completely read, hence completing the time de-interleaving process. However, the numbers of columns and rows are respectively equal to the numbers of rows and columns of the transmitter, and so the size of the DRAM 132 is designed to be Nc×Nr (given the DRAM 132 is written according to a horizontal sequence and read according to a vertical sequence, the size of the DRAM 132 is Nr×Nc). FIG. 4a and FIG. 4b show sequences of writing/reading positions of a memory of a conventional time de-interleaving process when the memory bandwidth is equal to the size of cells. Similarly, the value in each grid represents the sequence of reading/writing from/into the memory addresses (FIG. 4a indicates the sequence of writing and FIG. 4b represents the sequence of reading), and the size of the word written/read into/from the DRAM 132 is also equal to the size of one cell. Thus, in the writing operation in FIG. 4a, the cells are written sequentially and vertically from the upper left corner, and a next column is written after a previous column is fully written. In the reading operation in FIG. 4a, the cells are sequentially and horizontally read from the upper left corner, and a next row is read after a previous row of completely read. The sequence of the numbers of the cell received by the DRAM 132 is the sequence of the interleaved cells: 0, 8, 16, 24, ..., 155, 4, ..., 151, 159, and the time de-interleaving operation is then complete (the DRAM 132 is written/read by 160+160=320 times). In a unit of FEC blocks (the cells numbered 0~39 are the $0^{th}$ FEC block, the cells numbered are the $1^{st}$ FEC block, and so forth), the cell de-interleaving circuit 140 then performs a cell de-interleaving process according to a permutation function by using a cell de-interleaving (CDI) buffer 142 (generally implemented by an SRAM).

In response to the design trend of system-on-chip (SoC), the DRAM 132 used by the time de-interleaving circuit 130 needs to be shared with other circuits in the system. However, due to a limited bandwidth of the DRAM 132, each circuit needs to minimize the number of times of accessing the DRAM 132 in order not to drag the performance of the system. One method for reducing the number of times of accessing the DRAM 132 is to increase the bandwidth in a way that the word read/written each time is increased. Assuming that the bandwidth of the DRAM 132 multiplied by four times (the word becomes 128 bits, and four cells are read/written each time), although the configuration of the memory is unchanged, the sequences of the addresses read/written are changed. FIG. 5a and FIG. 5b show schematic diagrams of addresses for storing cells and reading/writing sequences of a memory in a conventional time de-interleaving process and when a memory bandwidth is four times the size of cells. The vertical values (0~159) represent the numbers of the cells, and the horizontal values (0~39 in FIG. 5a, and 0~159 in FIG. 5b) represent the writing/reading sequences. FIG. 5a depicts the sequences of writing into the DRAM 132. During a writing operation, the words are sequentially and vertically written from the upper left corner. The words of the cells numbered 0, 8, 16 and 24 are written in the $0^{th}$ writing operation, the words of the cells numbered 32, 40, 48 and 56 are written in the $1^{st}$ writing operation, and so forth. Thus, a total of 40 writing operations needs be performed for the 160 cells on the DRAM 132. FIG. 5b depicts the sequences of reading from the DRAM 132. During a reading operation, the words are sequentially and horizontally read from the upper left corner, with however the cells being read according to a sequence of the cells numbered 0, 1, 2, 3 . . . . That is, the words of the cells numbered 0, 8, 16 and 24 are read in the $0^{th}$ reading operation, but only the cell numbered 0 is used. The words of the cells numbered 1, 9, 17 and 25 are read in the $1^{st}$ reading operation, but the cell numbered 1 is used, and so forth. Thus, in a writing operation, each word is read four times, and a total of 160 reading operations need to be performed for the 40 words. Using the above method for time de-interleaving the 160 cells, the total number of times of writing/reading into/from the DRAM 132 is 40+160=200 times. FIG. 6a and FIG. 6b show other schematic diagrams of addresses for storing cells and reading/writing sequences of a memory in a conventional time de-interleaving operation and when a memory bandwidth is four times the size of cells. FIG. 6a depicts the sequences of writing into the DRAM 132. In this method, although data of four cells is transmitted to the DRAM 132 each time, only one cell is written. That is, the words of the cells numbered 0, 8, 16 and 24 are written in four different times (corresponding to $0^{th}$, $1^{st}$, $2^{nd}$ and $3^{rd}$ writing operations), and the words of the cells numbered 32, 40, 48 and 56 are written in four different times (corresponding to the $4^{th}$, $5^{th}$, $6^{th}$ and $7^{th}$ writing operations), and so forth. Thus, the 40 words are written in 160 times. FIG. 6b depicts the sequences of reading from the DRAM 132. The reading operation is performed according to the sequences of the numbers of the cells, and so the words of the cells numbered 0, 1, 2 and 3 are read in the $0^{th}$ reading operation, the words of the cells numbered 4, 5, 6 and 7 are read in the $1^{st}$ reading operation, and so forth. Thus, 40 reading operations need to be performed for these 160 cells. Using this method for time de-interleaving, the total number of times of writing/reading into/from the DRAM 132 is 160+40=200 times.

Although increasing the bandwidth of the DRAM (the methods in FIGS. 5a/5b and FIGS. 6a/6b) reduces the number of times of writing into or reading from the DRAM 132, for a system having a high memory utilization frequency, the overall performance of the system may be further enhanced if the number of times of reading/writing the memory during time de-interleaving operations can be reduced.

SUMMARY OF THE INVENTION

The invention is directed to a time de-interleaving circuit and a time de-interleaving method to reduce the number of times that a time de-interleaving process accesses a memory.

The present invention discloses a time de-interleaving circuit, which is located in a signal receiver of a communication system and used for time de-interleaving an interleaved signal. The interleaved signal includes a plurality of cells. The time de-interleaving circuit includes: a memory module, storing the cells, the cells forming a plurality of cell groups each comprising a plurality of cells, the memory module accessed in a unit of one cell group; and a buffer memory module, buffering a part of the cells from the memory module to arrange an output sequence of the cells.

The present invention further discloses a time de-interleaving circuit, which is in a signal receiver of a communication system and used for time de-interleaving an interleaved signal. The interleaved signal includes a plurality of cells. The time de-interleaving circuit includes: a memory module, storing the cells, the cells forming a plurality of cell groups each comprising a plurality of cells, the memory module accessed in a unit of one cell group; and a buffering memory module, buffering a part of the cells to be written into the memory module to arrange a sequence of writing the cells into the memory module.

The present invention further discloses a time de-interleaving method, which is applied in a time de-interleaving circuit of a communication system to de-interleave an interleaved signal. The interleaved signal includes a plurality of cells. The de-interleaving circuit includes a memory module. The memory module is accessed in a unit of one cell group that includes a plurality of cells. The method includes: writing the cells of the interleaved signal into the memory module; reading the cells from the memory module and selectively buffering the cells. In the time de-interleaving process, for the same cell group, the memory module is written once and read once.

In the time de-interleaving circuit and the time de-interleaving method of the present invention, an additional buffering memory is used to reduce the number of times that the time de-interleaving process accesses the main memory of the system. Compared to the prior art, the cell group formed by the same cells is read from the main memory once and written into the main memory once. Thus, the number of times of accessing the main memory of the system can be effectively reduced to enhance the system performance.

The above and other aspects of the invention will become better understood with regard to the following detailed description of the preferred but non-limiting embodiments. The following description is made with reference to the accompanying drawings.

BRIEF DESCRIPTION OF THE DRAWINGS

Figures 2A, 2B:
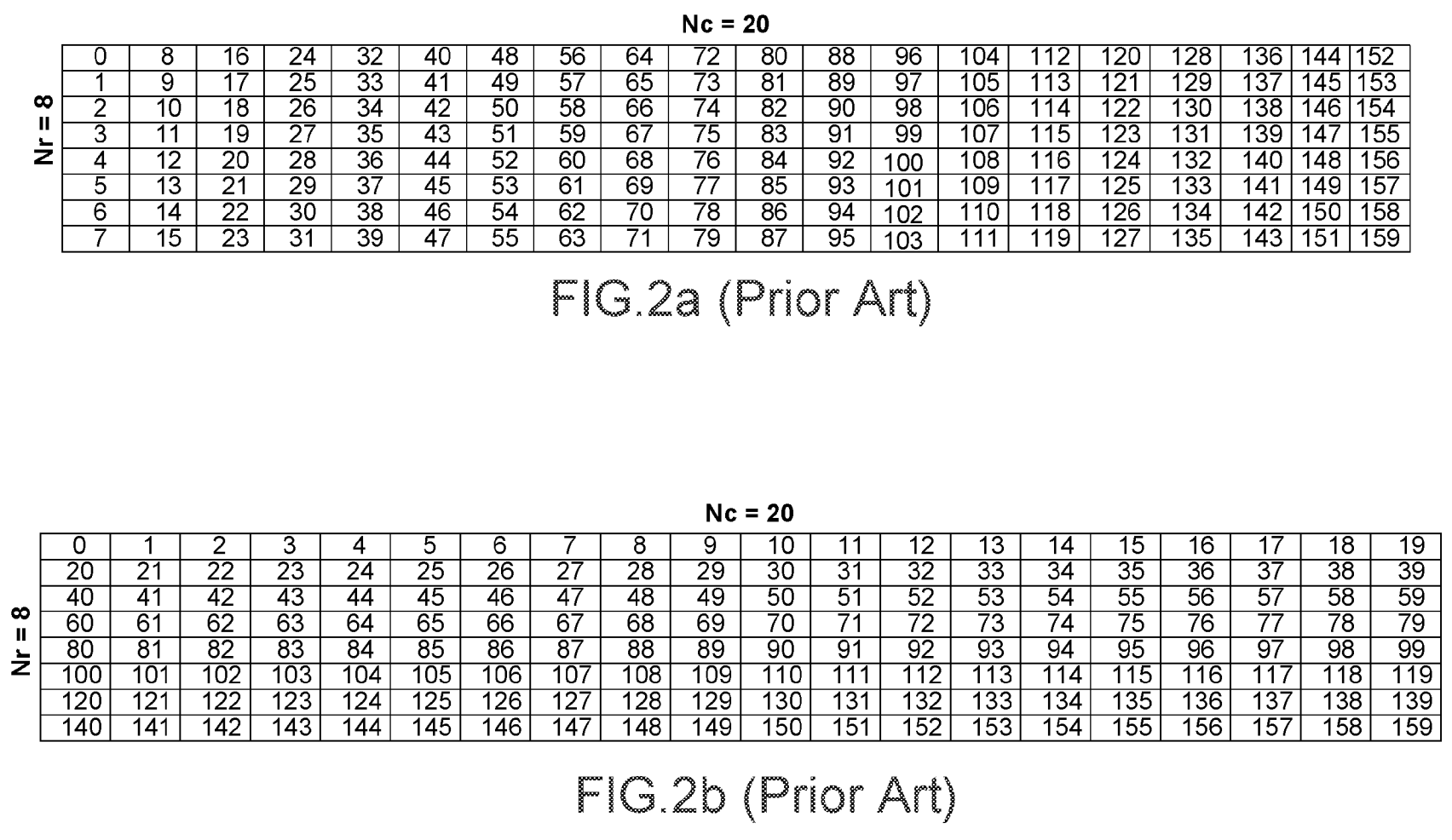

FIG. 2a and FIG. 2b are configuration diagrams of a memory conventionally used for time de-interleaving;

FIG. 4a and FIG. 4b are sequences of writing/reading positions of a memory in a conventional time de-interleaving process when a memory bandwidth is equal to the size of cells;

Figures 5A, 5B:
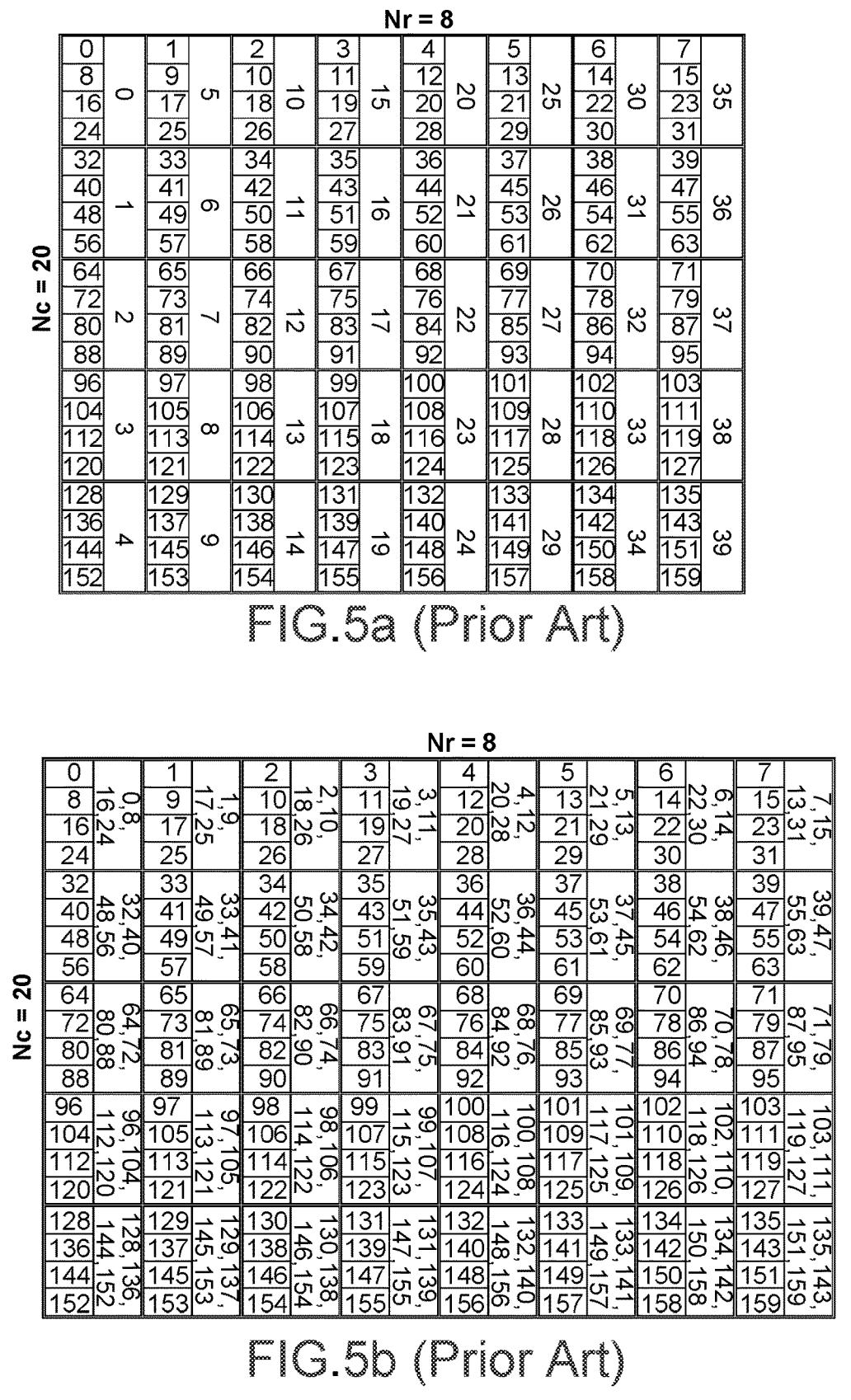

FIG. 5a and FIG. 5b are schematic diagrams of addresses for storing cells and reading/writing sequences of a memory in a conventional time de-interleaving process and when a memory bandwidth is four times the size of cells;

Figures 6A, 6B:
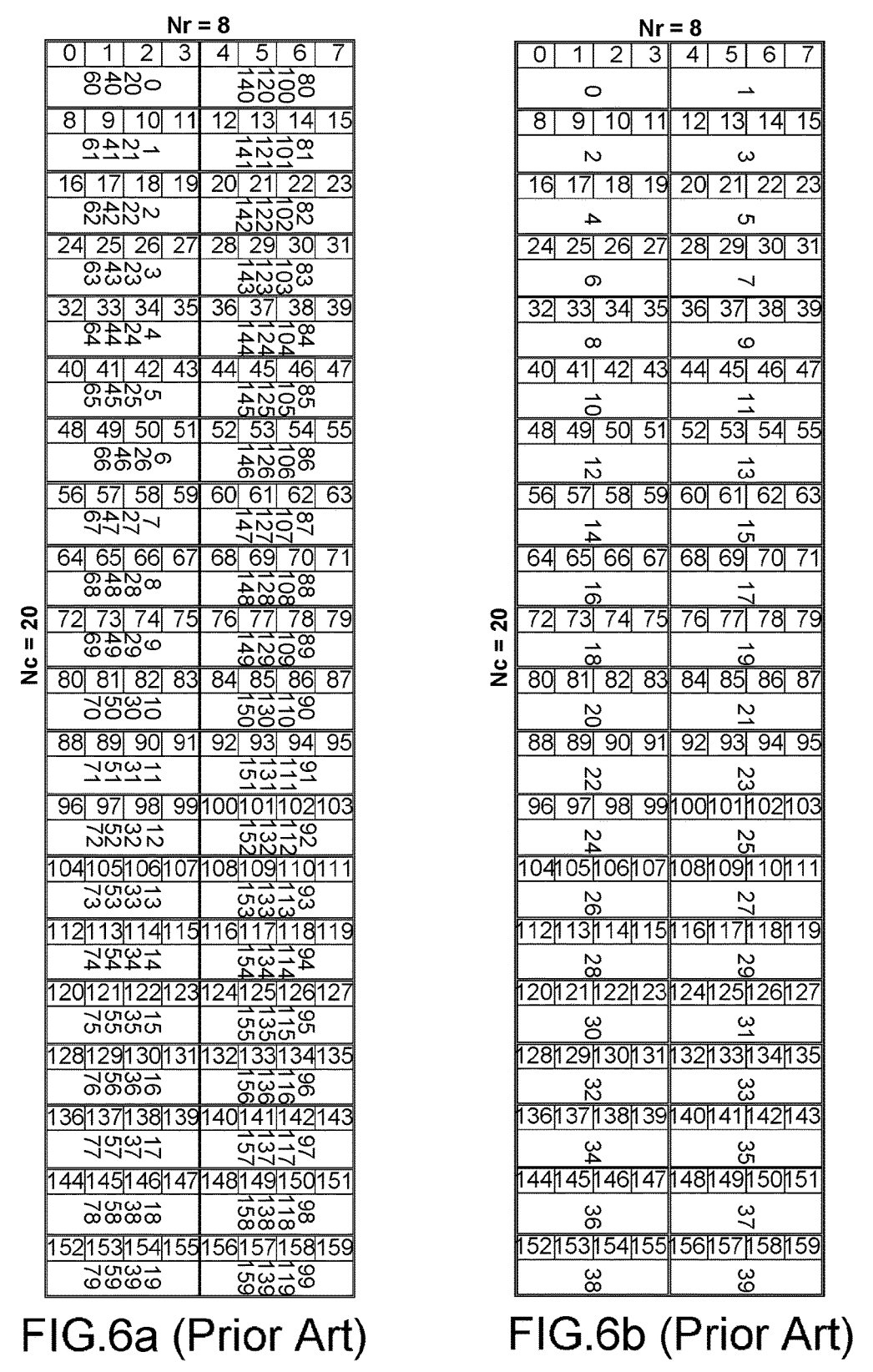

FIG. 6a and FIG. 6b are other diagrams of addresses for storing cells and reading/writing sequences of a memory in a conventional time de-interleaving process and when a memory bandwidth is four times the size of cells;

FIG. 8a and FIG. 8b are other schematic diagrams of cell numbers and access sequences of a memory 714 and a memory 721 when the present invention is applied for a time de-interleaving process and a memory bandwidth is four times the size of cells;

FIG. 9a to FIG. 9d are other schematic diagrams of memory addresses, cell numbers and reading/writing sequences of the memory 714 and the memory 721 when the present invention is applied for a time de-interleaving process and a memory bandwidth is four times the size of cells;

FIG. 10a to FIG. 10d are schematic diagrams of memory addresses, cell numbers and reading/writing sequences of the memory 714 and the memory 721 when the present invention is applied for a time de-interleaving process and a memory bandwidth is two times the size of cells;

FIG. 11a to FIG. 11d are schematic diagrams of memory addresses, cell numbers and reading/writing sequences of the memory 714 and the memory 721 when the present invention is applied for a time de-interleaving process and a memory bandwidth is eight times the size of cells;

FIG. 12a and FIG. 12b are a memory utilization amount and the number of times of reading/writing a memory under different low-density parity-check (LDPC) block lengths and different modulation modes of the present invention;

FIG. 14a and FIG. 14b are schematic diagrams of cell numbers and reading/writing sequences of a memory 1314 and a memory 1321 when the present invention is applied for a time de-interleaving process and a memory bandwidth is four times the size of cells;

FIG. 15a to FIG. 15d are other schematic diagrams of memory addresses, cell numbers and reading/writing sequences of the memory 1314 and the memory 1321 when the present invention is applied for a time de-interleaving process and a memory bandwidth is four times the size of cells;

FIG. 16a to FIG. 16d are schematic diagrams of memory addresses, cell numbers and reading/writing sequences of the memory 1314 and the memory 1321 when the present invention is applied for a time de-interleaving process and a memory bandwidth is two times the size of cells;

FIG. 17a to FIG. 17d are schematic diagrams of memory addresses, cell numbers and reading/writing sequences of the memory 1314 and the memory 1321 when the present invention is applied for a time de-interleaving process and a memory bandwidth is eight times the size of cells;

FIG. 18a and FIG. 18b are schematic diagrams of a memory utilization amount and the number of times of reading/writing a memory under different LDPC block lengths and different modulation modes of the present invention;

DETAILED DESCRIPTION OF THE INVENTION

Technical terms of the application are based on the general definition in the technical field of the application. If the application describes or explains one or some terms, definitions of the terms are based on the description or explanation of the application.

The present invention discloses a time de-interleaving circuit and a time de-interleaving method capable of reducing the number of times that a time de-interleaving process accesses a memory. In possible implementations, one skilled person in the art may choose equivalent elements or steps to implement the disclosure based on the disclosure of the application. That is, the implementation of the disclosure is not limited in the embodiments disclosed in the disclosure. Further, a part of the elements included in the time de-interleaving circuit of the disclosure may be individually known elements. Without affecting the full disclosure and possible implementation of the device, details of the known elements are omitted. Further, the time de-interleaving method of the present invention may be performed by the time de-interleaving circuit of the present invention or an equivalent device. Without affecting full disclosure of the present invention and possible implementation, the description of the method of the application focuses on the steps instead of hardware.

Figure 1:
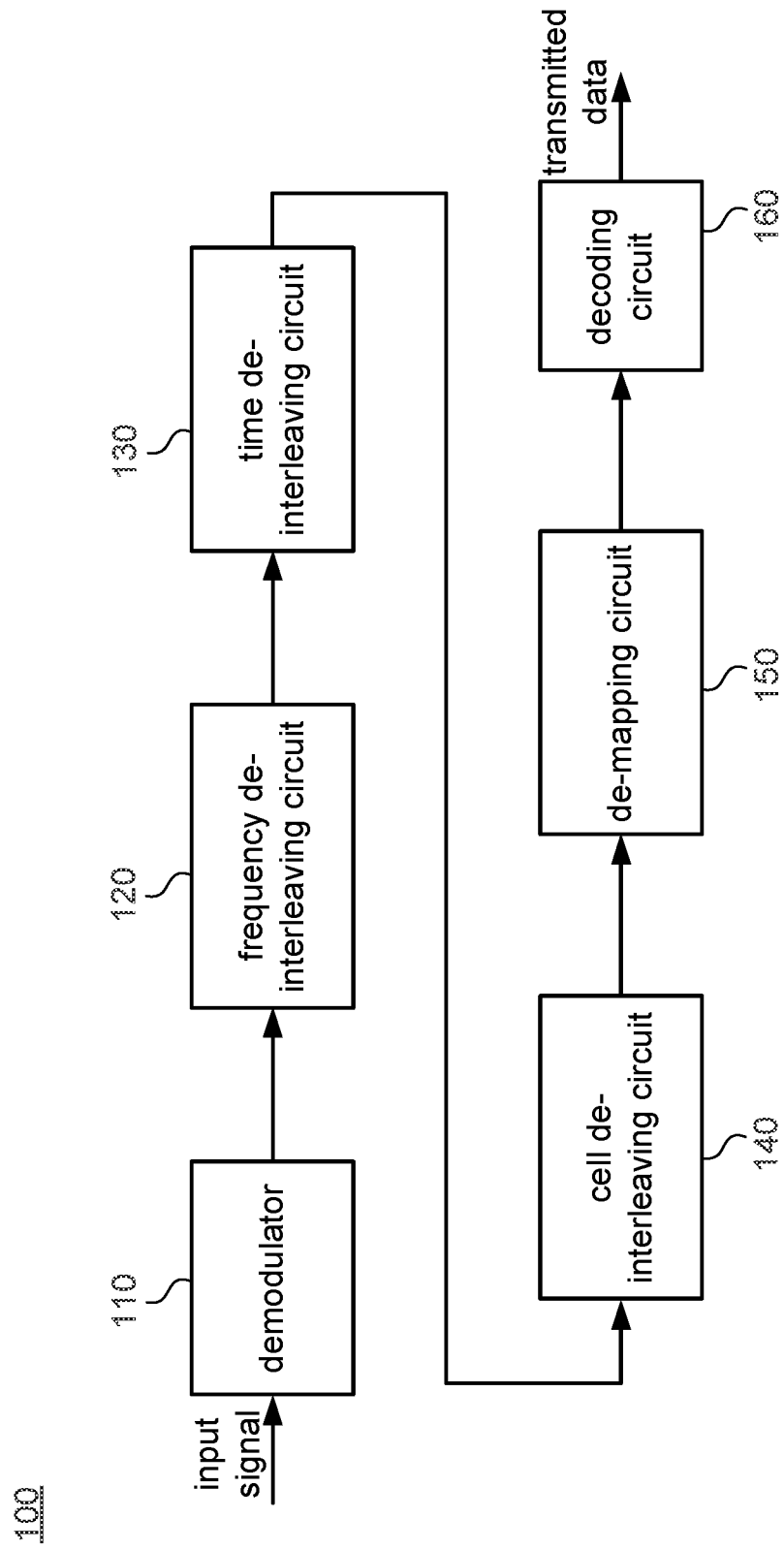
FIG. 1 is a block diagram of a conventional signal receiver.
Figure 3:
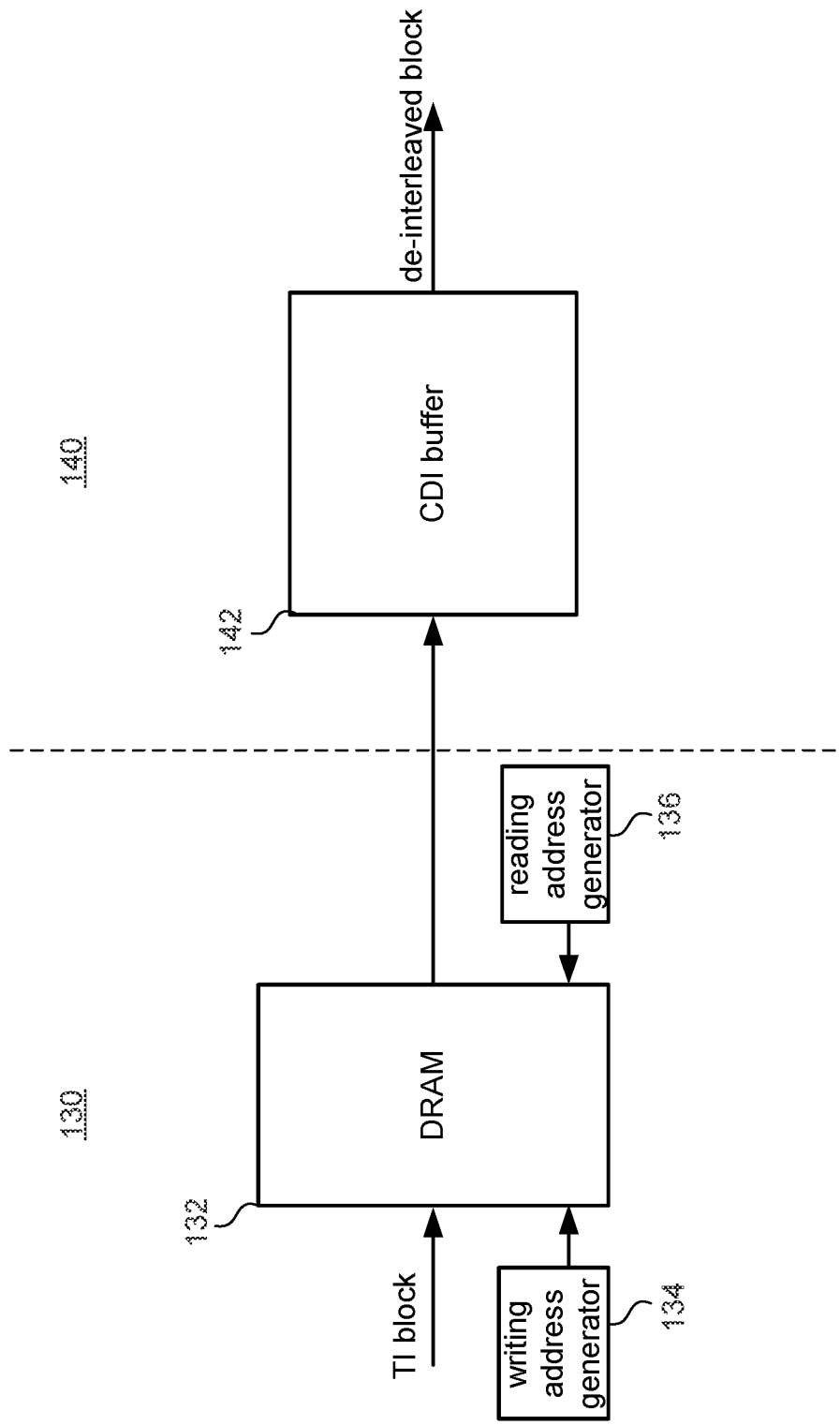
FIG. 3 is a block diagram of a time de-interleaving circuit and a cell de-interleaving circuit of a conventional signal receiver.
Figure 7:
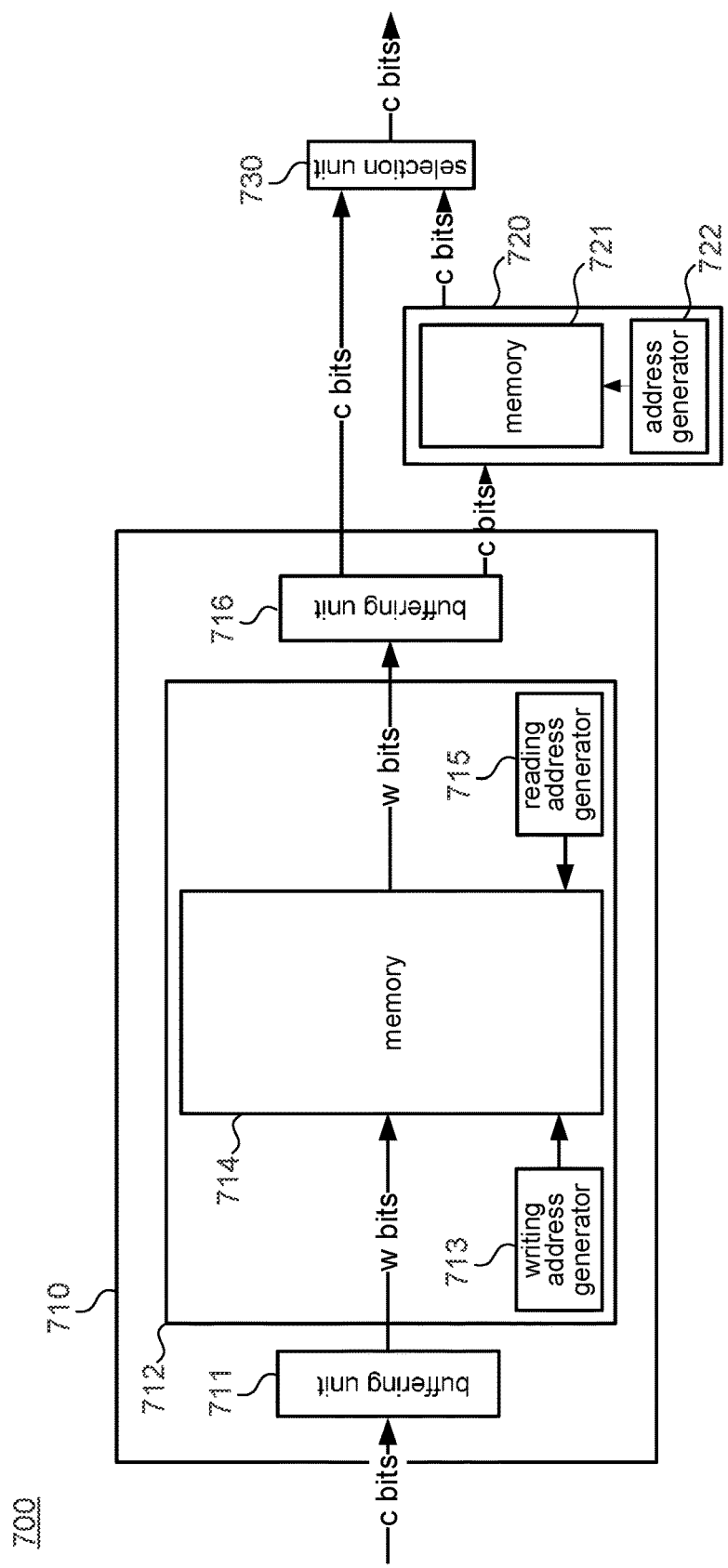
FIG. 7 is a block diagram of a time de-interleaving circuit according to an embodiment of the present invention.

FIG. 7 shows a block diagram of a time de-interleaving circuit according to an embodiment of the present invention. A time de-interleaving circuit 700 includes a storage circuit 710, a buffering memory module 720 and a selection unit 730. The storage circuit 710 includes a buffering unit 711, a memory module 712 and a buffering unit 716. In the embodiment, the bandwidth of the memory module 710 is w bits (i.e., a word accessed each time is w bits), and the size of one cell is c bits. After the buffering unit 711 (e.g., a first-in-first-out (FIFO) buffer) stores w/c cells (w bits), the w/c cells are also written into the memory 714 of the memory module 712. Similarly, the word read from the memory module 712 is also first buffered in the buffering unit 716 (e.g., a FIFO buffer), and is then outputted in a unit of cells to the buffering memory module 720 and the selection unit 730. The memory module 712 includes a writing address generator 713 and a reading address generator 715, which respectively generate target memory addresses for writing and reading operations of the memory 714. Similarly, the buffering memory module 720 includes an address generator 722 that generates addresses for reading and writing operations of the memory 721. In one preferred embodiment, the memory 714 is a dynamic random access memory (DRAM), and the memory 721 is a static random access memory (SRAM). The selection unit 730 selectively outputs the direct output of the storage circuit 710 or the buffered data of the buffering memory module 720 as the output of the time de-interleaving circuit 700.

Figure 8A:
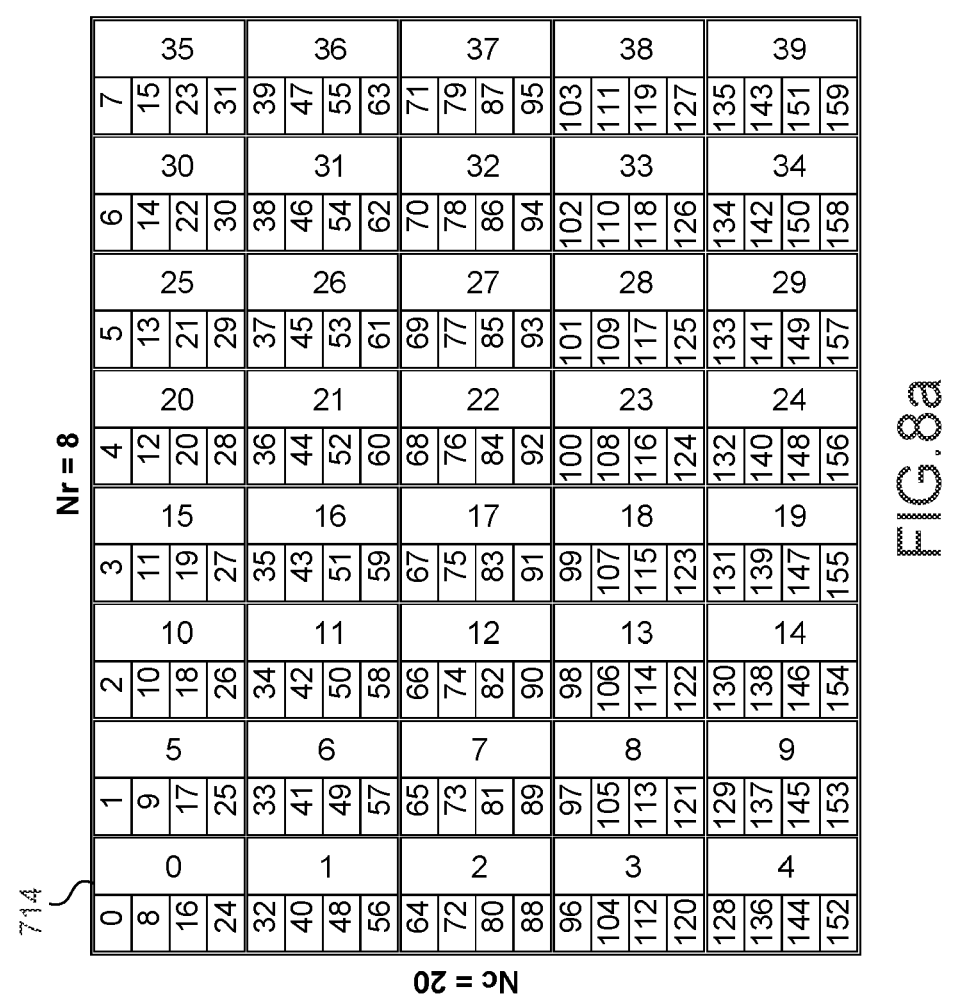
Figure 8B:
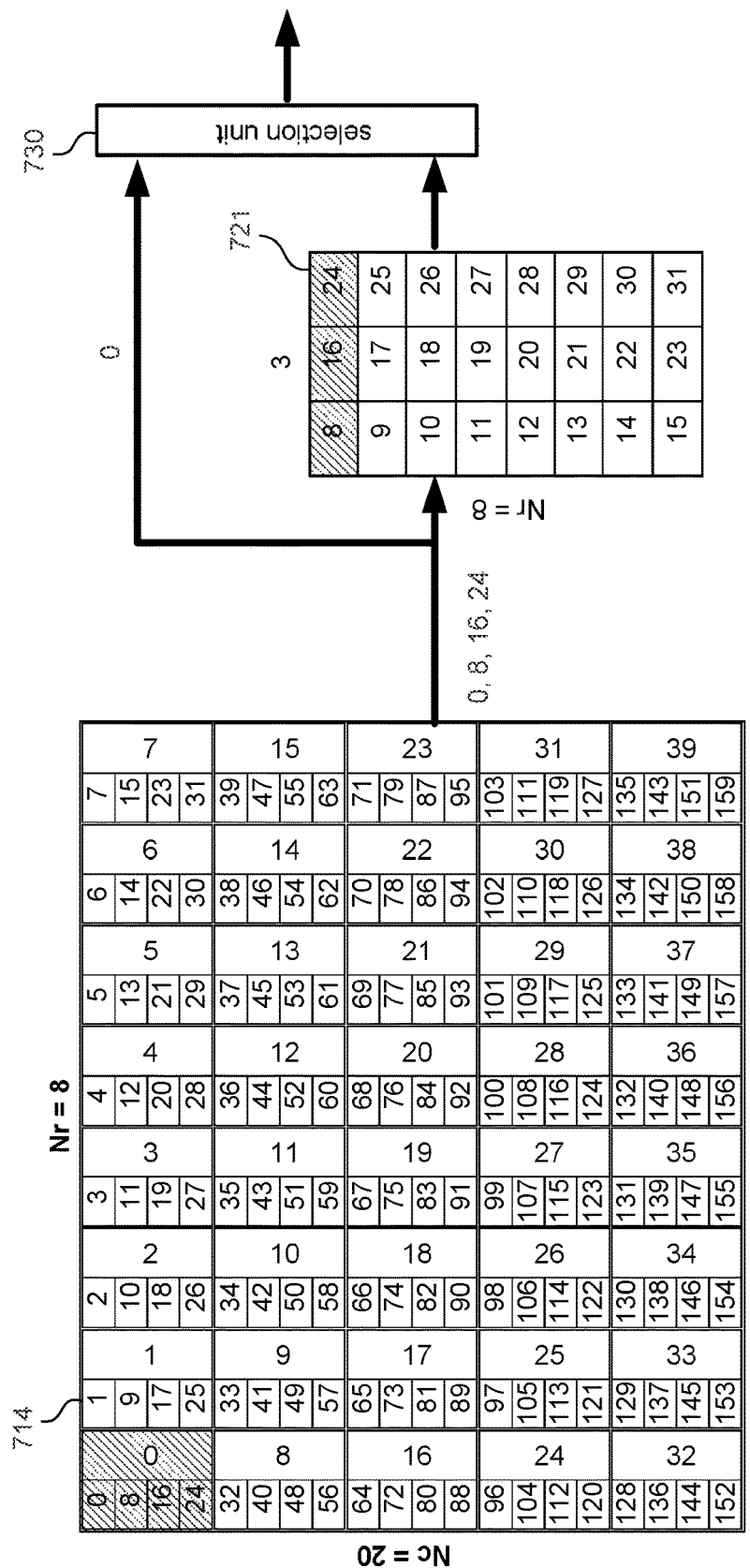

FIG. 8a shows a schematic diagram of cell numbers and sequences of writing into the memory 713 when the present invention is applied for a time de-interleaving process and a memory bandwidth is four times the size of cells. Similarly, the vertical values represent numbers of the cells (0~159), and the horizontal values represent sequences of writing into the memory 714. 160 units of the cells are distributed in 20 rows and 8 columns. In a writing operation, one cell group is used as a unit, and the cell groups are written sequentially and vertically from the upper left corner, and a next column is written after a previous column is fully written. In the embodiment, one cell group (i.e., one word) includes four cells, and 160 cells are divided into 40 cell groups. Thus, 40 writing operations are needed in total. FIG. 8b shows a schematic diagram of cell numbers and sequences of reading from the memory 713 and the memory 721 when the present invention is applied for a time de-interleaving process and a memory bandwidth is four times the size of cells. The cells are also read in a unit of a cell group from the memory 713, and so 40 reading operations are needed for 160 cells. However, in the reading sequence, the cell groups are read sequentially and horizontally from the upper left corner, and a next row is read after a previous row is completely read. The cells numbered 0, 8, 16 and 24 (the cell group indicated by the shaded area) are read in the $0^{th}$ reading operation, and this cell group is buffered in the buffering unit 716. In a unit of one cell for outputting data, the buffering unit 716 outputs a part of the cells to the memory 721 of the buffering memory module 720 and a part to the selection unit 730. As seen from the diagram, in the $0^{th}$ reading operation, the cell numbered 0 is directly outputted to the selection unit 730, whereas cells otherwise numbered are written into the $1^{st}$ row of the memory 721. Similarly, in the $1^{st}$ reading operation, the cell numbered 1 is directly outputted to the selection unit 730, whereas the cells otherwise numbered (9, 17 and 25) are written into the $2^{nd}$ row of the memory 721, and so forth. After the $7^{th}$ reading operation (at this point, the cell numbered 7 is directly outputted to the selection unit 730, whereas cells otherwise numbered (15, 23 and 31) are written into the $8^{th}$ row of the memory 721), the selection unit 130 selects to output the cells buffered in the memory 721 (the output sequence is cells numbered 8, 9, 10, 11, . . . , 15, 16, 17, . . . , 30 and 31). After successively outputting 24 cells (i.e., having outputted all the buffered cells in the memory 721), in reading operations performed on the memory 714, the selection unit 730 selects to directly output a part of the output of the buffering unit 716 to serve as the output of the time de-interleaving circuit 700, whereas the other part that is not directly outputted is buffered in the memory 721. The above operation steps are repeated until all of the cells in the memory 714 are completely read, and the cell sequence outputted by the time de-interleaving circuit 700 is a result of the de-interleaving operation. In conclusion, in the embodiment, with the assistance of the memory 721, the output sequences of the cells can be arranged or altered. Thus, for the same cell group, the memory 714 is read only once and written only once, and the de-interleaving process can be completed. Therefore, the time de-interleaving circuit 700 of the embodiment only needs to perform a total of 40+40=80 access (reading/writing) operations on the memory 714. Compared to known technologies, the present invention significantly reduces the number of times of reading/writing the memory 714.

Figures 9A, 9B:
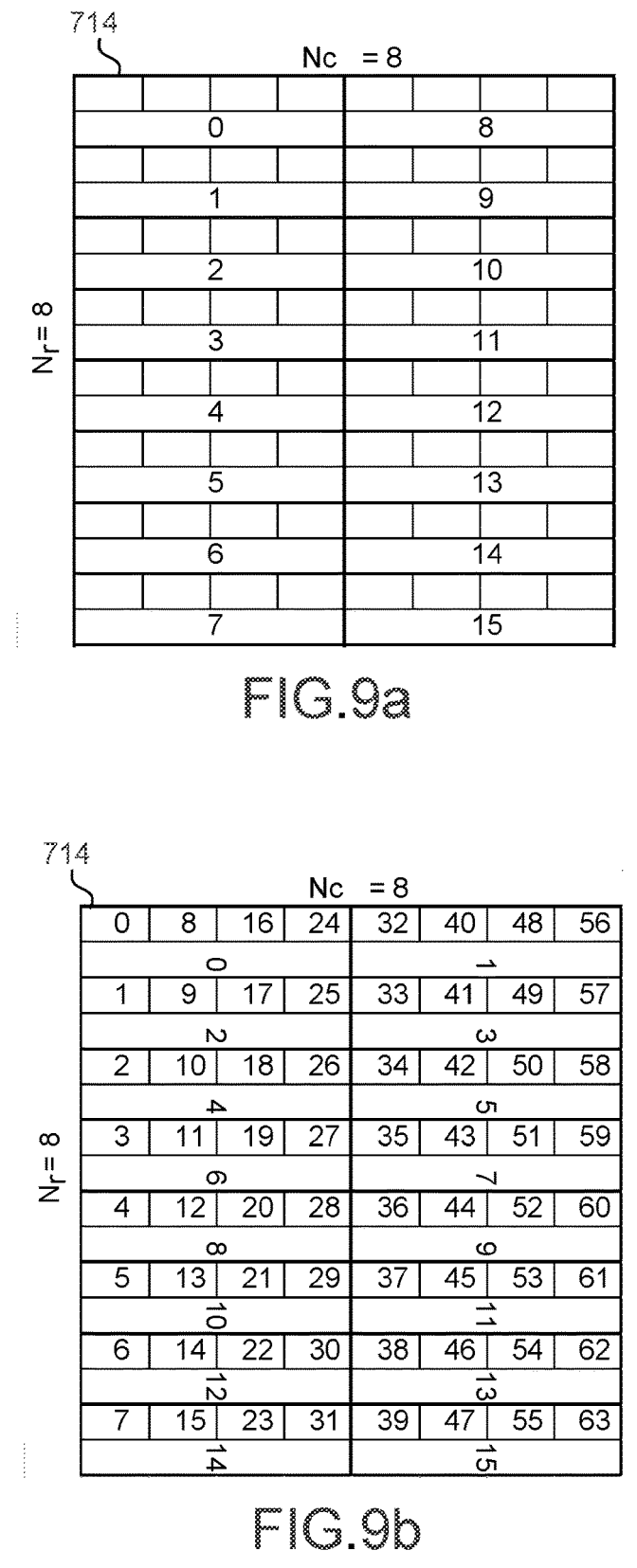
Figures 9C, 9D:
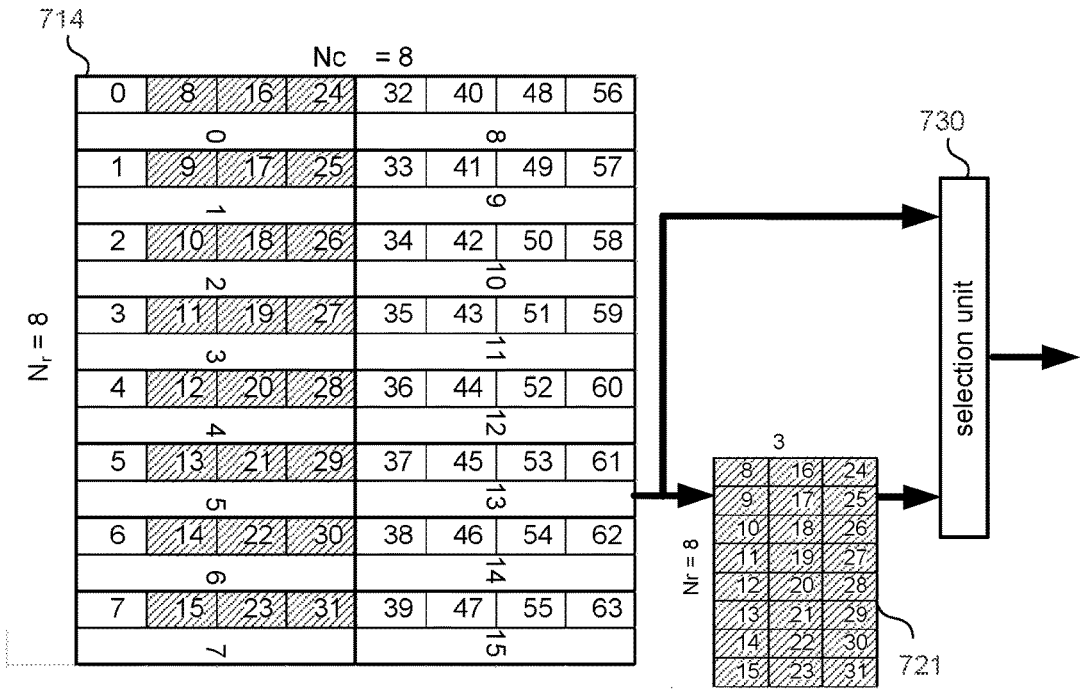

Details of reading/writing the memories 714 and 721 of the present invention are further given by using different cell number (64) and ratio (w/c) of the bandwidth to the cell size. FIG. 9a, FIG. 9b, FIG. 9c and FIG. 9d show schematic diagrams of memory addresses, cell numbers and reading/writing sequences of the memory 714 and the memory 721 when the present invention is applied for a time de-interleaving process and the bandwidth of the memory is four times the size of cells. FIG. 9a depicts the address numbers of the memory 714. There are a total of 16 (0~15) addresses, and each of the addresses may be written by one cell group (including four cells). FIG. 9b depicts the sequence of writing into the memory 714. The cell groups are sequentially and horizontally written from the upper left corner, and a next row is written after a previous row is fully written. The writing address generator 713 generates addresses according to a rule below:

$$\text{for}\left(i = 0; i < \left\lceil \frac{N_c}{4} \right\rceil \times N_r; i = i + 1\right)\{$$

$$C_i = i \bmod \left\lceil \frac{N_c}{4} \right\rceil$$

-continued $$R_i = i \, div \left\lceil \frac{N_c}{4} \right\rceil$$

$$WR_i = C_i \times N_r + R_i\}$$

In the above equations, i represents the number of the cell group that the buffering unit 711 sequentially outputs, there are a total of $$\left(\frac{N_c}{4}\right) \times N_r$$

cell groups (the divisor 4 means that each word includes four cells), mod is an operator for obtaining the remainder, and div is an operator for obtaining the quotient, and $WR_i$ is a written address. Thus, written addresses and written contents are as follows. In the $0^{th}$ writing operation, the cell group including cells numbered {0, 8, 16, 24} is written to the memory address 0; in the $1^{st}$ writing operation, the cell group including cells numbered {32, 40, 48, 56} is written to the memory address 8; in the $2^{nd}$ writing operation, the cell group including cells numbered {1, 9, 17, 25} is written to the memory address 1; in the $14^{th}$ writing operation, the cell group including cells numbered {7, 15, 23, 31} is written to the memory address 7; and in the $15^{th}$ writing operation, the cell group including cells numbered {39, 47, 55, 63} is written to the memory address 15.

FIG. 9c depicts the sequence of reading from the memory 714. The cell groups are sequentially and vertically written from the upper left corner, and a next column is read after a previous column is completely read. The reading address generator 715 generates addresses according to a rule below:

$$\text{for}\left(i = 0; i < \left\lceil \frac{N_c}{2} \right\rceil \times N_r; i = i + 1\right)\{$$

$$C_i = i \, div \, N_r$$

$$R_i = i \bmod N_r$$

$$RD_i = C_i \times N_r + R_i = i\}$$

In the above equations, $RD_i$ is a read address. Thus, the read addresses and the read contents are as follows. In the $0^{th}$ reading operation, the cell group including cells numbered {0, 8, 16, 24} is read from the memory address 0, the cell numbered 0 is directly outputted, and the cells numbered 8, 16 and 24 are buffered in the memory 721; in $1^{st}$ reading operation, the cell group including cells numbered {1, 9, 17, 25} is read from the memory address 1, the cell numbered 1 is directly outputted, and the cells numbered 9, 17 and 25 are buffered in the memory 721; in the $2^{nd}$ reading operation, the cell group including cells numbered {2, 10, 18, 26} is read from the memory address 2, the cell numbered 2 is directly outputted, and the cells numbered 10, 18 and 26 are buffered in the memory 721; in the $14^{th}$ reading operation, the cell group including cells numbered {38, 46, 54, 62} is read from the memory address 14, the cell numbered 38 is directly outputted, and the cells numbered 46, 54 and 62 are buffered in the memory 721; and in the $15^{th}$ reading operation, the cell group including cells numbered {39, 47, 55, 63} is read from the memory address 15, the cell numbered 39 is directly outputted, and the cells numbered 47, 55 and 63 are buffered in the memory 721.

The memory 721 may simultaneously store $N_r \times (w/c-1)$ cells (w representing the data amount of one word, and c representing the data amount of one cell). In this embodiment, w/c=4, and so the memory 721 may simultaneously store Nr×3 (=24) cells. FIG. 9d depicts the address numbers of the memory 721. There are a total of 24 (0~23) addresses, and the address generator 722 generates addresses according to a rule below for a writing operation:

$$\text{for } (i = 0; i < 3N_r; i = i + 1)\{ \\ \text{BufWR}_i = i \\ \}$$

The address generator 722 generates addresses according to a rule below when the memory 721 is read:

$$\text{for } (i = 0; i < 3N_r; i = i + 1)\{ \\ \text{BufRD}_i = (i \bmod N_r) \times \left(\frac{w}{c} - 1\right) + (i \text{ div } N_r) \\ \}$$

In this embodiment, each time after selecting and successively outputting Nr (=08) cells from the buffering unit 716, the selection unit 730 successively outputs $(w/c-1) \times Nr$ cells from the memory 721, i.e., outputting all the cells buffered in the memory 721.

Figures 10A, 10B:
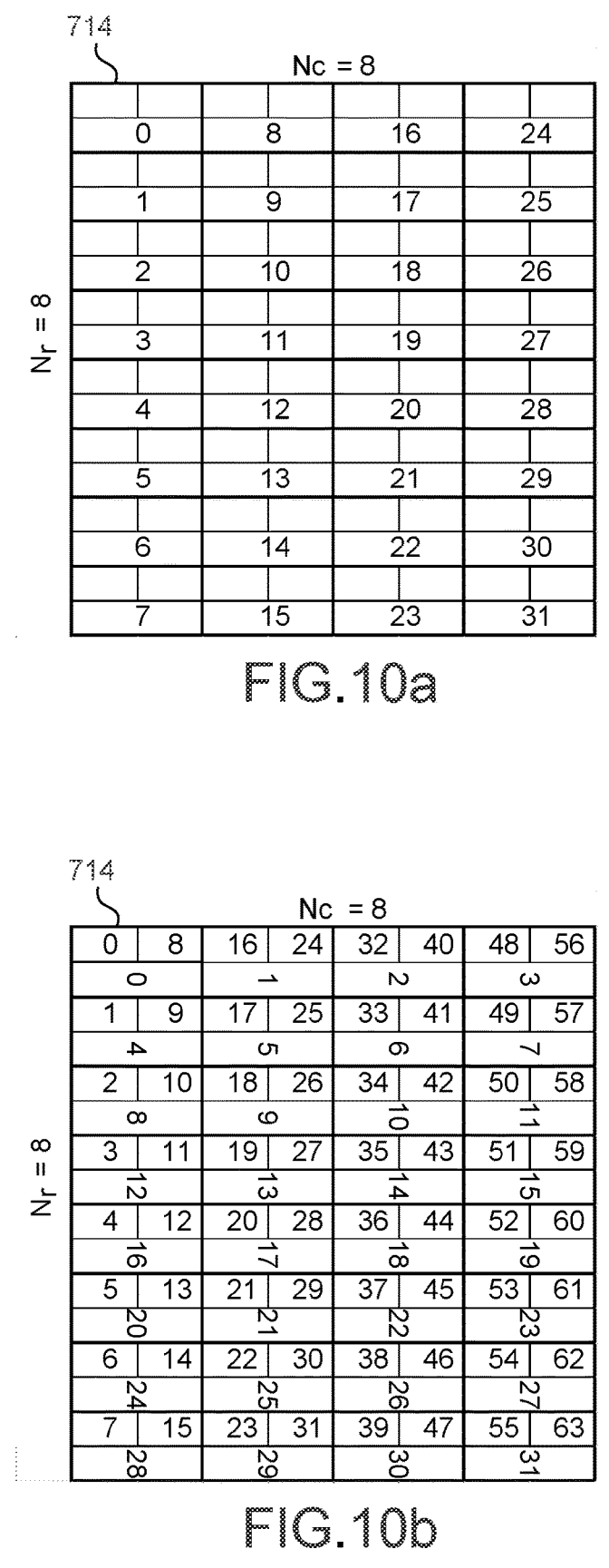
Figure 10C:
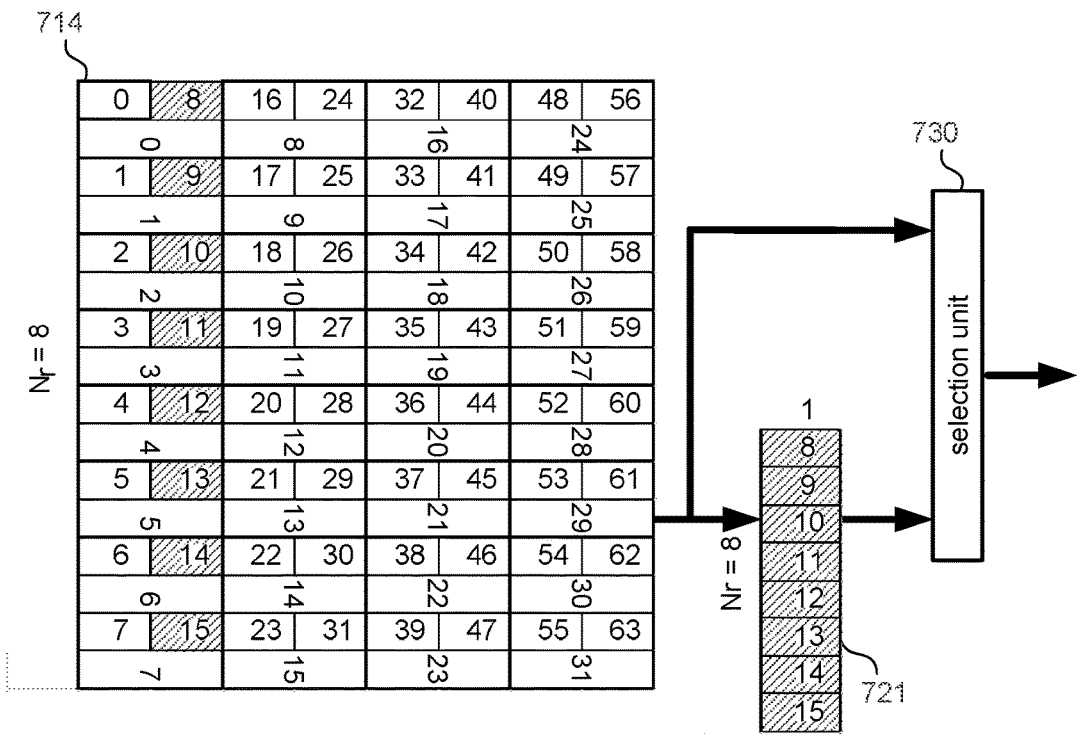

FIG. 10a, FIG. 10b, FIG. 10c and FIG. 10d are schematic diagrams of memory addresses, cell numbers and reading/writing sequences of the memory 714 and the memory 721 when the present invention is applied for a time de-interleaving process and the memory bandwidth is two times the size of cells. FIG. 10a depicts the address numbers of the memory 714. There are a total of 32 (0~31) addresses, and each of the addresses may be written by one cell group (including 2 cells). FIG. 10b depicts the sequence of writing into the memory 714. The cell groups are sequentially and horizontally written from the upper left corner, and a next row is written after a previous row is fully written. The writing address generator 713 generates addresses according to a rule below:

$$\text{for } \left(i = 0; i < \left\lceil \frac{N_c}{2} \right\rceil \times N_r; i = i + 1\right)\{ \\ C_i = i \bmod \left\lceil \frac{N_c}{2} \right\rceil \\ R_i = i \text{ div } \left\lceil \frac{N_c}{2} \right\rceil \\ WR_i = C_i \times N_r + R_i \\ \}$$

In the above equations, i represents the number of the cell group that the buffering unit 711 sequentially outputs, and there are a total of $$\left(\frac{N_c}{2}\right) \times N_r$$

cell groups (the divisor 2 means that each word includes two cells).

FIG. 10c depicts the sequence of reading from the memory 714. The cell groups are sequentially and vertically read from the upper left corner, and a next column is read after a previous column is completely read. The reading address generator 715 generates addresses according to a rule below:

$$\text{for } \left(i = 0; i < \left\lceil \frac{N_c}{2} \right\rceil \times N_r; i = i + 1\right)\{ \\ C_i = i \text{ div } N_r \\ R_i = i \bmod N_r \\ RD_i = C_i \times N_r + R_i = i \\ \}$$

Figure 10D:
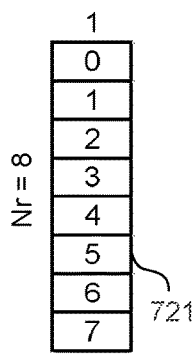

The memory 721 may simultaneously store $$N_r \times \left(\frac{w}{c} - 1\right)$$

cells. In this embodiment, w/c=2, and so the memory 721 may simultaneously store Nr (=8) cells. FIG. 10d depicts address numbers of the memory 721, and there are a total of 8 (0~7) addresses. The address generator 722 generates addresses according to a rule below for a writing operation:

$$\text{for } (i = 0; i < N_r; i = i + 1)\{ \\ \text{BufWR}_i = i \\ \}$$

The address generator 722 generates addresses according to a rule below when the memory 721 is read:

$$\text{for } (i = 0; i < N_r; i = i + 1)\{ \\ \text{BufRD}_i = i \\ \}$$

In this embodiment, each time after selecting and successively outputting Nr (=8) cells, the selection unit 730 successively outputs $(w/c-1) \times Nr$ cells from the memory 721.

Figures 11A, 11B:
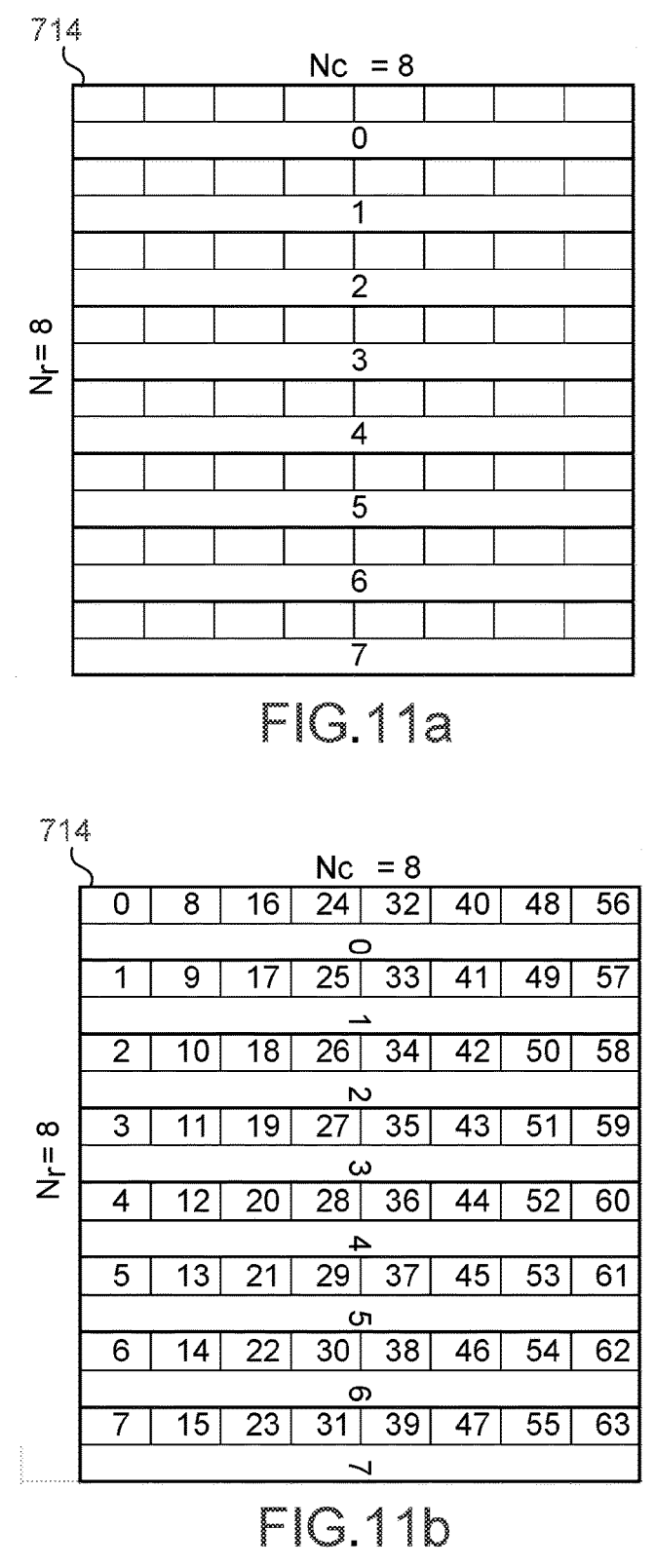
Figures 11C, 11D:
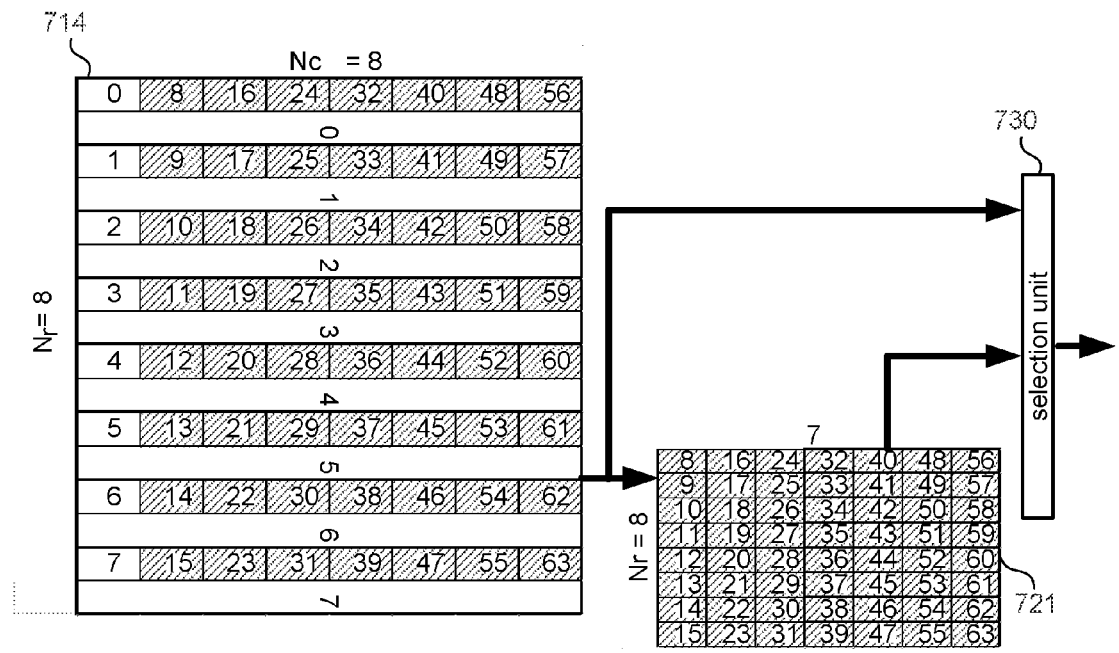

FIG. 11a, FIG. 11b, FIG. 11c and FIG. 11d are schematic diagrams of memory addresses, cell numbers and reading/writing sequences of the memory 714 and the memory 721 when the present invention is applied for a time de-interleaving process and the memory bandwidth is eight times of the size of cells. FIG. 11a depicts address numbers of the memory 714. There are a total of eight (0~7) addresses, and each of the addresses may be written by one cell group (including 8 cells). FIG. 11b depicts the sequence of writing into the memory 714. The writing address generator 713 generates addresses according to a rule below:

$$\text{for } \left(i = 0; i < \left\lceil \frac{N_c}{8} \right\rceil \times N_r; i = i + 1\right)\{ \\ C_i = i \bmod \left\lceil \frac{N_c}{8} \right\rceil \\ R_i = i \text{ div } \left\lceil \frac{N_c}{8} \right\rceil \\ WR_i = C_i \times N_r + R_i \\ \}$$

In the equations above, i represents the number of the cell group that the buffering unit 711 sequentially outputs, and there are a total of $$\left(\frac{N_c}{8}\right) \times N_r$$

cell groups (the divisor 8 means that each word includes eight cells).

FIG. 11c depicts the sequence of reading from the memory 714. The reading address generator 715 generates addresses according to a rule below:

$$\text{for } \left(i = 0; i < \left\lceil \frac{N_c}{8} \right\rceil \times N_r; i = i + 1\right)\{$$

$$C_i = i \text{ div } N_r$$
$$R_i = i \bmod N_r$$
$$RD_i = C_i \times N_r + R_i = i$$
$$\}$$

The memory 721 may simultaneously store $$N_r \times \left(\frac{w}{c} - 1\right)$$

cells. In this embodiment, w/c=8, and so the memory 721 may simultaneously store Nr×7 (=56) cells. FIG. 11d depicts the address numbers of the memory 721. There are a total of 56 (0~55) addresses, and the address generator 722 generates addresses according to a rule below for a writing operation:

$$\text{for } (i = 0; i < 7N_r; i = i + 1)\{$$
$$\quad BufWR_i = i$$
$$\}$$

The address generator 722 generates addresses according to a rule below when the memory 721 is read:

$$\text{for } (i = 0; i < 7N_r; i = i + 1)\{$$

$$BufRD_i = (i \bmod N_r) \times \left(\frac{w}{c} - 1\right) + (i \text{ div } N_r)$$

$$\}$$

In this embodiment, each time after selecting and successively outputting Nr (=08) cells from the buffering unit 716, the selection unit 730 successively outputs (w/c−1)×Nr cells from the memory 721.

FIG. 12a and FIG. 12b show a memory utilization amount and the number of times of reading/writing a memory under different low-density parity-check (LDPC) block lengths and different modulation modes in the present invention. FIG. 12a shows the sizes of the memory 714 and the memory 721 required under different LDPC block lengths and different modulation modes. The memory 721 is divided into the three patterns above (having bandwidths respectively being two times, four times and eight times of the size of cells). FIG. 12b shows the number of times of reading/writing the memory 714 for different LDPC block lengths and different modulation modes (also divided into the three patterns above), and ratios to the number of times of reading/writing of the prior art. The results show that, under the same LDPC block length and the same modulation mode, regardless of the ratio of the bandwidth size to the size of cells, compared to the prior art, the present invention effectively reduces the number of times of accessing (reading/writing) the memory, and such effect is particularly significant as w/c gets larger.

Figure 13:
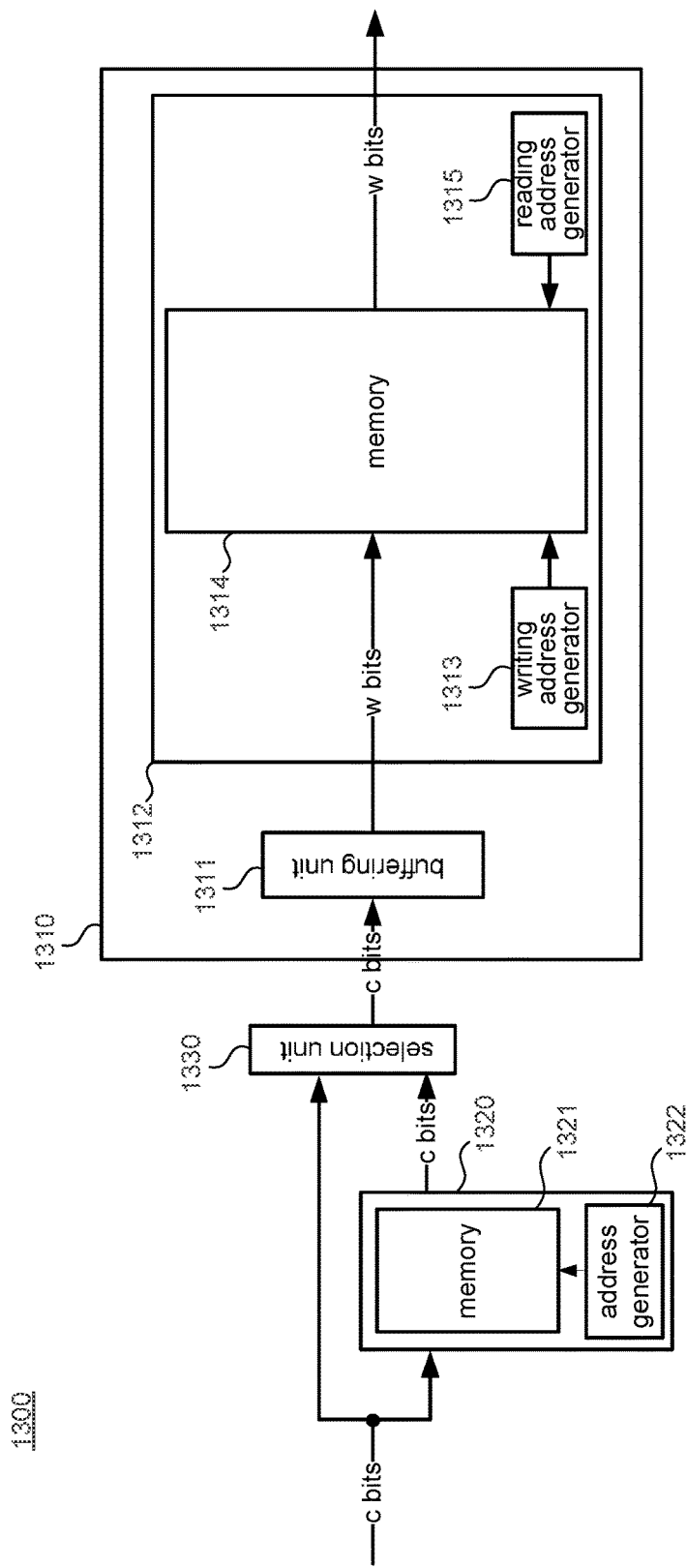
FIG. 13 is a block diagram of a time de-interlacing circuit according to another embodiment of the present invention.

FIG. 13 shows a block diagram of a time de-interleaving circuit according to another embodiment of the present invention. A time de-interleaving circuit 1300 includes a storage circuit 1310, a buffering memory module 1320 and a selection unit 1330. The storage circuit 1310 includes a buffering unit 1311 and a memory module 1312. When cells of an interleaved signal are inputted into the time de-interleaving circuit 1300, a part is directly transmitted to the selection unit 1330, whereas a part is stored in the buffering memory module 1320. The selection unit 1330 determines to select and transmit the directly inputted cells or the buffered cells to the buffering unit 1311 of the storage circuit 1310. When the buffering unit 1311 (e.g., a FIFO buffer) stores w/c cells (one cell group), the w/c cells are also written into the memory 1314 of the memory module 1312. The memory module 1312 includes a writing address generator 1313 and a reading address generator 1315, which respectively generate target memory addresses for writing and reading operations of the memory 1314. Similarly, the buffering memory module 1312 includes an address generator 1322 that generates addresses of reading and writing the memory 1321. In one preferred embodiment, the memory 1314 is a DRAM, and the memory 1321 is an SRAM.

Figure 14A:
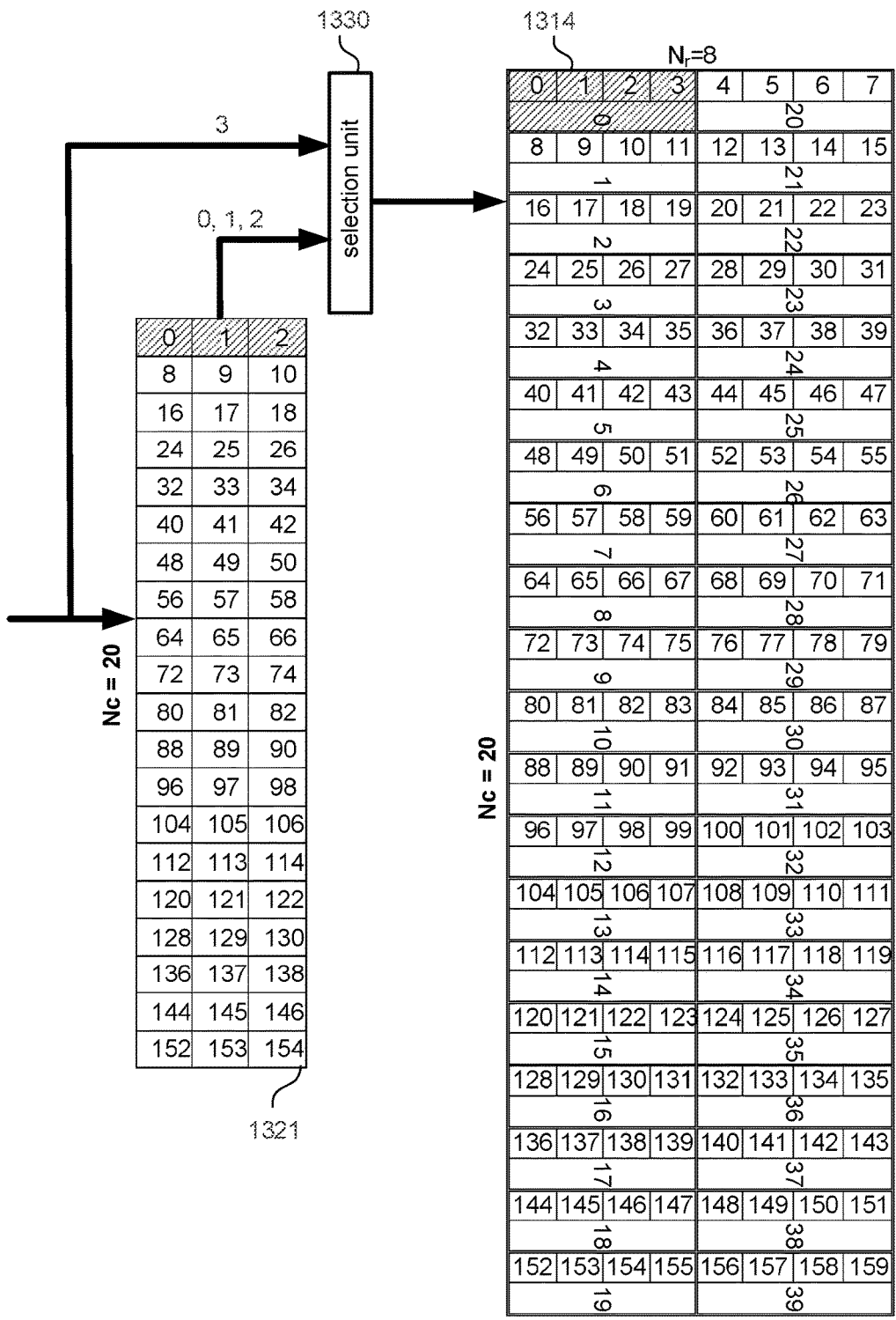
Figure 14B:
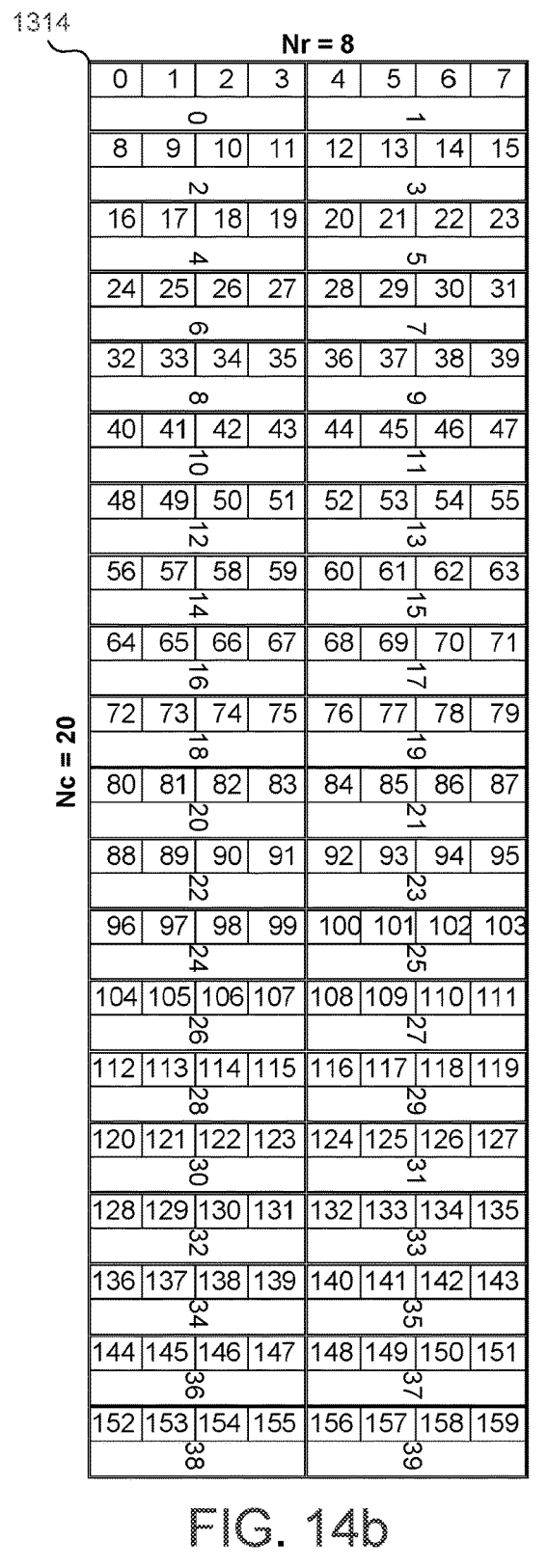

FIG. 14a shows of cell numbers and writing sequences of the memory 1314 and the memory 1321 when the present invention is applied to a time de-interleaving process and a memory bandwidth is four times the size of cells. Similarly, the vertical values represent numbers of the cells (0~159), and the horizontal values (0~39) represent sequences of writing into the memory 1314. The cells numbered 0, 8, 16, 24, . . . , 152, 1, 9, 153, 2, 10, . . . and 154 sequentially enter the time de-interleaving circuit 1300, and are sequentially buffered in the memory 1321. After the cell numbered 3 enters the time de-interleaving circuit 1300, the selection unit 1330 reads the cells numbered 0, 1 and 2 from the memory 1321 and transmits the cells numbered 0, 1 and 2 along with the cell numbered 3 to the buffering unit 1311. These four cells form a cell group in the buffering unit 1311, and are written into the memory 1314. Similarly, after the cell numbered 11 enters the time de-interleaving circuit 1300, the selection unit 1330 reads the cells numbered 8, 9 and 10 from the memory 1321. These four cells form a cell group in the buffering unit 1311, and are then written into the memory 1314, and so forth. Thus, the 160 cells are written in form of cell groups each including four cells, and a total of 40 writing operations are performed on the memory 1314. FIG. 14b shows a schematic diagram of cell numbers and the sequence of reading from the memory 1314 when the present invention is applied for a time de-interleaving process and a memory bandwidth is four times the size of cells. The reading sequences are as shown by the horizontal values in the diagram. The reading operation is performed in a unit of a cell group, 40 reading operations are performed for 160 cells, and the cells numbered 0, 1, 2, . . . , 79, 80, 81, . . . , 158 and 159 are sequentially outputted, hence achieving the effect of time de-interleaving. In the embodiment, with the assistance of the memory 1321, for the same cell group, the memory 1314 is read only once and written only once, and the de-interleaving process can be completed. Therefore, the time de-interleaving circuit 1300 of the embodiment only needs to perform a total of 40+40=80 reading/writing operations on the memory 1314. Compared to known technologies, the present invention significantly reduces the number of times of accessing (reading/writing) the memory 1314.

Figures 15A, 15B:
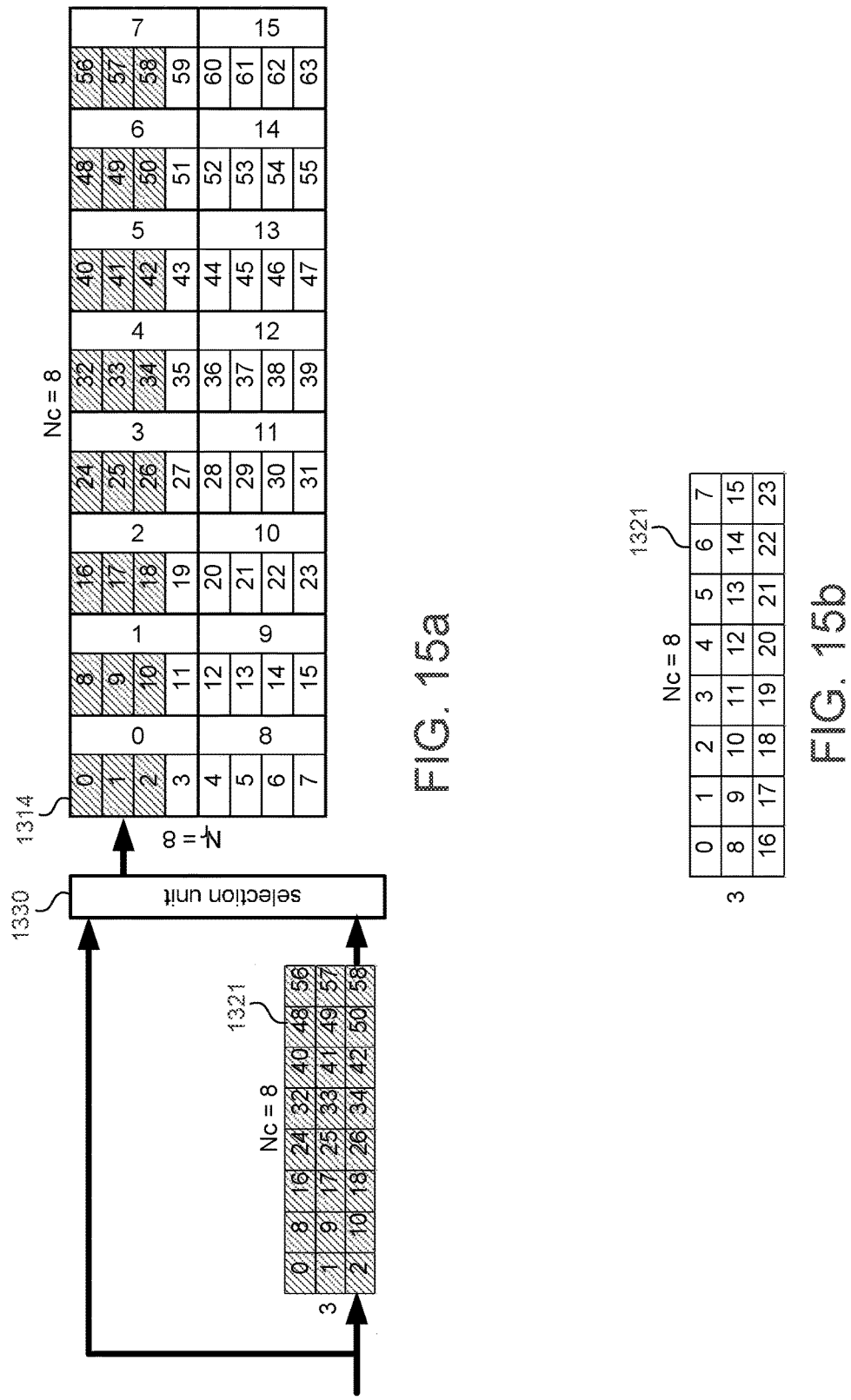

Details of accessing (reading/writing) the memories 1314 and 1321 of the present invention are further given by using different cell number (64) and ratio (w/c) of the bandwidth to the cell size. FIG. 15a, FIG. 15b, FIG. 15c and FIG. 15d show schematic diagrams of memory addresses, cell numbers and reading/writing sequences of the memory 1314 and the memory 1321 when the present invention is applied for a time de-interleaving process and the bandwidth of the memory is four times the size of cells. FIG. 15a depicts the sequences of buffering the cells in the memory 1321 and writing the cell groups into the memory 1314. FIG. 15b depicts the address numbers of the memory 1321. The memory 1321 may simultaneously store $$N_c \times \left(\frac{w}{c} - 1\right)$$

cells, and so there are a total of 24 (0~23) addresses. The writing address generator 1322 generates addresses according to a rule below when the memory 1321 is written:

$$\text{for } (i = 0; i < 3N_c; i = i + 1)\{ \\ \quad \text{BufWR}_i = i \\ \}$$

The address generator 1322 generates addresses according to a rule below when the memory 1321 is read:

$$\text{for } (i = 0; i < 3N_c; i = i + 1)\{ \\ \quad \text{BufRD}_i = \left(i \bmod \left(\frac{w}{c} - 1\right)\right) \times N_r + \left(i \text{ div} \left(\frac{w}{c} - 1\right)\right) \\ \}$$

Figures 15C, 15D:
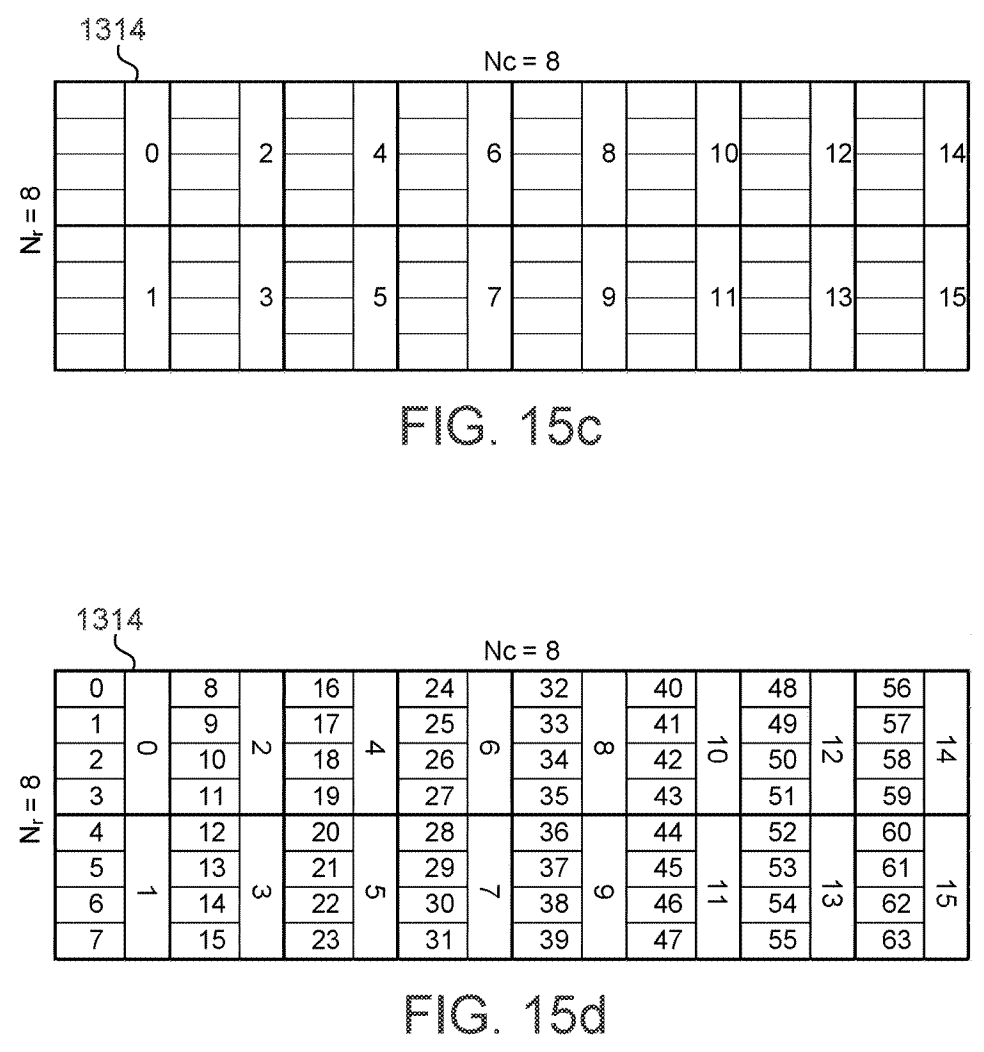

FIG. 15c depicts the address numbers of the memory 1314. There are a total of 16 (0~15) addresses, and each of the addresses may be written by one cell group (including four cells). The cell groups are sequentially and horizontally written from the upper left corner when the memory 1314 is written (referring to FIG. 15a), and a next row is written after a previous row is fully written. The writing address generator 1313 generates addresses according to a rule below:

$$\text{for } \left(i = 0; i < N_c \times \left\lceil \frac{N_r}{4} \right\rceil; i = i + 1\right)\{ \\ \quad C_i = i \bmod N_c \\ \quad R_i = i \text{ div } N_c \\ \quad \text{WR}_i = C_i \times \left\lceil \frac{N_r}{4} \right\rceil + R_i \\ \}$$

There are a total of $$N_c \times \left(\frac{N_r}{4}\right)$$

cell groups (the divisor 4 means that one word includes four cells). The written addresses and the written contents are as follows. In the $0^{th}$ reading operation, the cells numbered 0, 1 and 2 are read from the memory 1321, and are written along with the directly inputted cell numbered 3 to the address 0 of the memory 1314; in the $1^{st}$ reading operation, the cells numbered 8, 9 and 10 are read from the memory 1321, and are written along with the directly inputted cell numbered 11 to the address 2 of the memory 1314; in the $2^{nd}$ reading operation, the cells numbered 16, 17 and 18 are read from the memory 1321, and are written along with the directly inputted cell numbered 19 to the address 4 of the memory 1314; . . . ; in the $14^{th}$ reading operation, the cells numbered 52, 53 and 54 are read from the memory 1321, and are written along with the directly inputted cell numbered 55 to the address 13 of the memory 1314; and in the $15^{th}$ reading operation, the cells numbered 60, 61 and 62 are read from the memory 1321, and are written along with the directly inputted cell numbered 63 to the address 15 of the memory 1314.

FIG. 15d depicts the sequence of reading from the memory 1314. The cell groups are sequentially and vertically read from the upper left corner, and a next column is read after a previous column is completely read. The reading address generator 1315 generates addresses according to a rule below:

$$\text{for } \left(i = 0; i < N_c \times \left\lceil \frac{N_r}{4} \right\rceil; i = i + 1\right)\{ \\ \quad C_i = i \text{ div } \left\lceil \frac{N_r}{4} \right\rceil \\ \quad R_i = i \bmod \left\lceil \frac{N_r}{4} \right\rceil \\ \quad \text{RD}_i = C_i \times \left\lceil \frac{N_r}{4} \right\rceil + R_i = i \\ \}$$

The read addresses and read contents are as follows. In the 0th reading operation, the cell group including cells numbered {0, 1, 2, 3} is read from the address 0; in the $1^{st}$ reading operation, the cell group including cells numbered {4, 5, 6, 7} is read from the address 1; in the $2^{nd}$ reading operation, the cell group including cells numbered {8, 9, 10, 11} is read from the address 2; . . . ; in the $14^{th}$ reading operation, the cell group including cells numbered {56, 57, 58, 59} is read from the address 14; and in the $15^{th}$ reading operation, the cell group including cells numbered {60, 61, 62, 63} is read from the address 15.

Figures 16C, 16D:
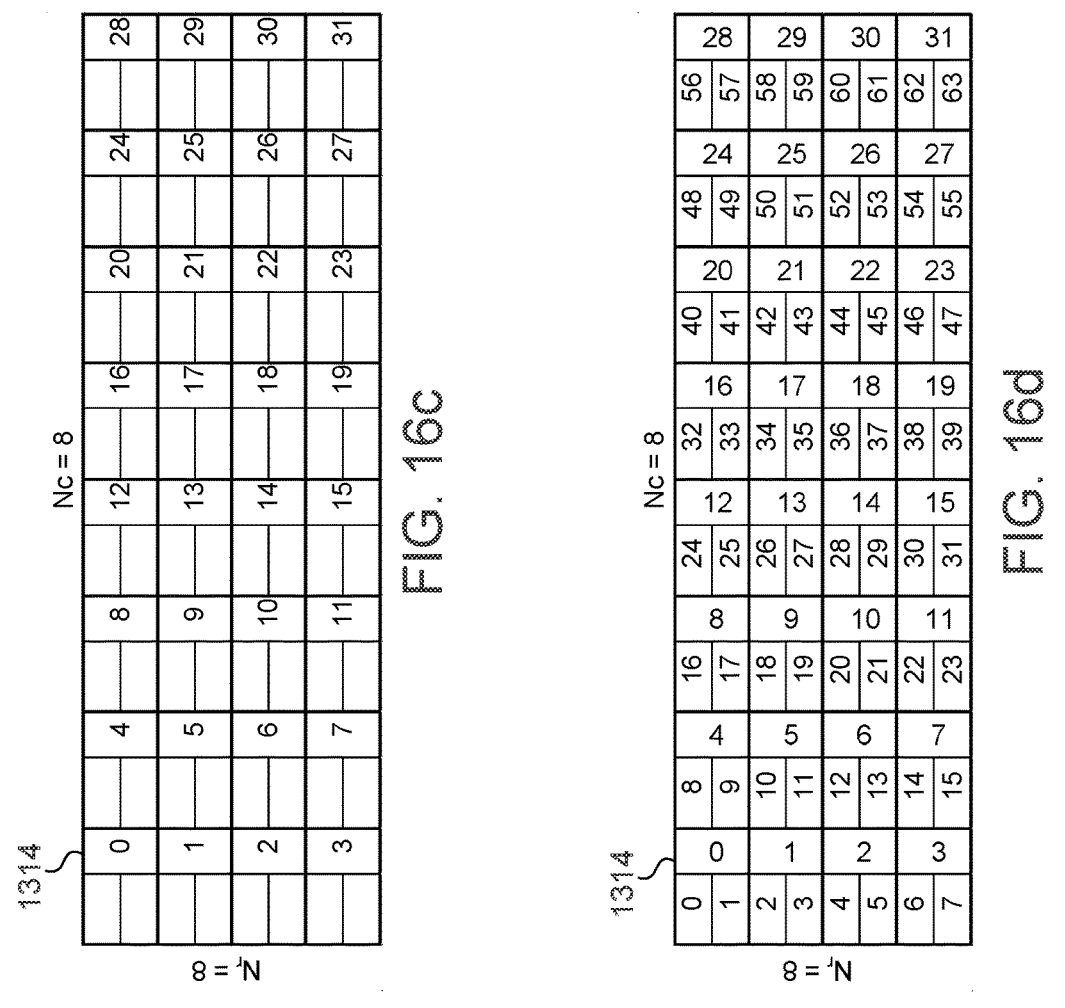

FIG. 16a, FIG. 16b, FIG. 16c and FIG. 16d are schematic diagrams of memory addresses, cell numbers and reading/writing sequences of the memory 1314 and the memory 1321 when the present invention is applied for a time de-interleaving process and a memory bandwidth is two times the size of cells. FIG. 16a depicts the sequences of buffering the inputted cells in the memory 1321 and writing the cell groups into the memory 1314. FIG. 16b depicts the address numbers of the memory 1321. The memory 1321 may simultaneously store $$N_c \times \left(\frac{w}{c} - 1\right)$$

cells, and there are a total of eight (0~7) addresses. The address generator 1322 generates addresses according to a rule below when the memory 1321 is written:

```
for (i = 0; i < N_c; i = i + 1){
    BufWR_i = i
}
```

The address generator 1322 generates addresses according to a rule below when the memory 1321 is read:

```
for (i = 0; i < N_c; i = i + 1){
    BufRD_i = i
}
```

FIG. 16c depicts the address numbers of the memory 1314. There are a total of 32 (0~31) addresses, and each of the addresses may be written by one cell group (including two cells). The writing address generator 1313 generates addresses according to a rule below when the memory 1314 is written:

$$\text{for } \left(i = 0; i < N_c \times \left\lceil \frac{N_r}{2} \right\rceil; i = i + 1\right)\{$$
$$C_i = i \bmod N_c$$
$$R_i = i \operatorname{div} N_c$$
$$WR_i = C_i \times \left\lceil \frac{N_r}{2} \right\rceil + R_i$$
$$\}$$

There are a total of $$N_c \times \left(\frac{N_r}{2}\right)$$

cell groups (me divisor 2 means that each word includes two cells).

FIG. 16d depicts the sequence of reading from the memory 1314. The cell groups are sequentially and vertically read from the upper left corner, and a next column is read after a previous column is completely read. The reading address generator 1315 generates addresses according to a rule below:

$$\text{for } \left(i = 0; i < N_c \times \left\lceil \frac{N_r}{2} \right\rceil; i = i + 1\right)\{$$
$$C_i = i \operatorname{div} \left\lceil \frac{N_r}{2} \right\rceil$$
$$R_i = i \bmod \left\lceil \frac{N_r}{2} \right\rceil$$
$$RD_i = C_i \times \left\lceil \frac{N_r}{2} \right\rceil + R_i = i$$
$$\}$$

Figures 17A, 17B:
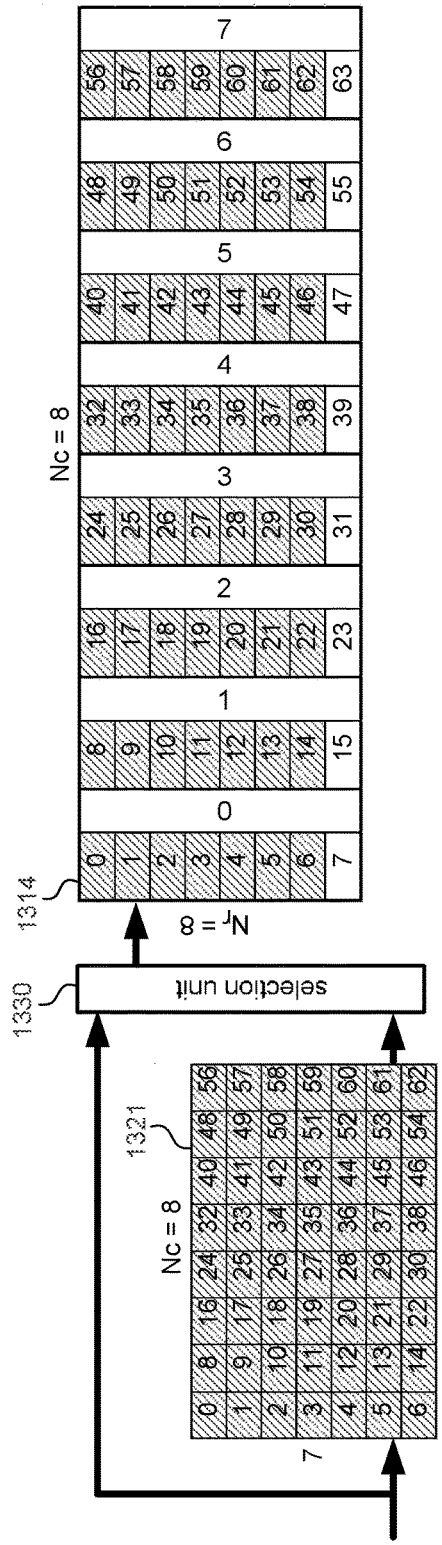

FIG. 17a, FIG. 17b, FIG. 17c and FIG. 17d are schematic diagrams of memory addresses, cell numbers and reading/writing sequences of the memory 1314 and the memory 1321 when the present invention is applied for a time de-interleaving process and a memory bandwidth is eight times the size of cells. FIG. 17a depicts the sequences of buffering the inputted cells in the memory 1321 and writing the cell groups into the memory 1314. FIG. 17b depicts the address numbers of the memory 1321. The memory 1321 may simultaneously store $$N_c \times \left(\frac{w}{c} - 1\right)$$

cells, and there are a total of 56 (0~55) addresses. The address generator 1322 generates addresses according to a rule below when the memory 1321 is written:

```
for (i = 0; i < 7N_c; i = i + 1){
    BufWR_i = i
}
```

The address generator 1322 generates addresses according to a rule below when the memory 1321 is read:

```
for (i = 0; i < 7N_c; i = i + 1){
    BufRD_i = (i mod 7) × N_c + (i div 7)
}
```

Figures 17C, 17D:
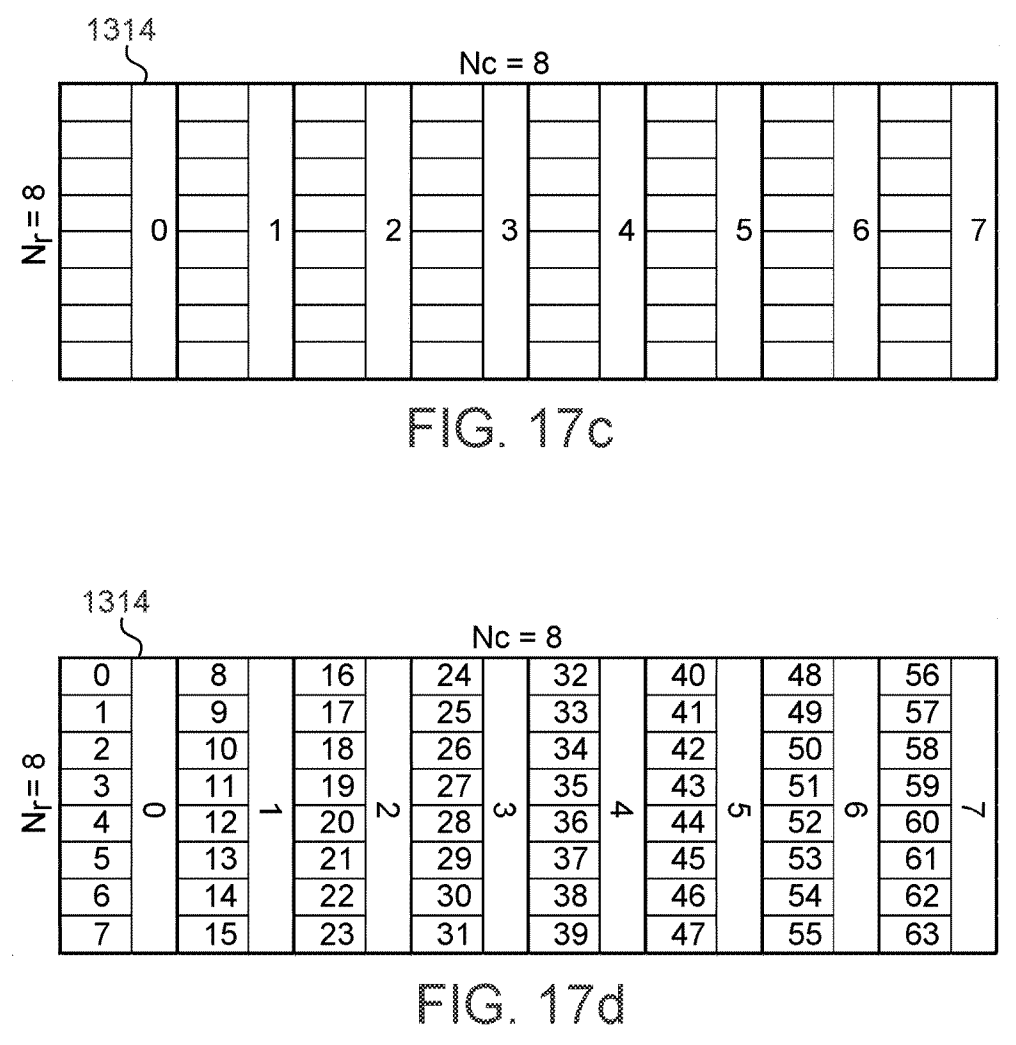

FIG. 17c depicts the address numbers of the memory 1314. There are a total of eight (0~7) addresses, and each of the addresses may be written by one cell group (including eight cells). The writing address generator 1313 generates addresses according to a rule below when the memory 1314 is written (referring to FIG. 17a):

$$\text{for } \left(i = 0; i < N_c \times \left\lceil \frac{N_r}{8} \right\rceil; i = i + 1\right)\{$$
$$C_i = i \bmod N_c$$
$$R_i = i \operatorname{div} N_c$$
$$WR_i = C_i \times \left\lceil \frac{N_r}{8} \right\rceil + R_i$$
$$\}$$

There are a total of $$N_c \times \left(\frac{N_r}{8}\right)$$

cell groups (the divisor 8 means that each word includes eight cells).

FIG. 17d depicts the sequence of reading from the memory 1314. The reading address generator 1315 generates addresses according to a rule below:

$$\text{for } \left(i = 0; i < N_c \times \left\lceil \frac{N_r}{8} \right\rceil; i = i + 1\right)\{$$
$$C_i = i \operatorname{div} \left\lceil \frac{N_r}{8} \right\rceil$$

-continued $$R_i = i \bmod \left\lceil \frac{N_r}{8} \right\rceil$$

$$RD_i = C_i \times \left\lceil \frac{N_r}{8} \right\rceil + R_i = i$$

}

FIG. 18a and FIG. 18b show a memory utilization amount and the number of times of reading/writing a memory under different LDPC block lengths and different modulation modes in the present invention. FIG. 18a shows the sizes of memory 1314 and the memory 1321 required under different LDPC block lengths and different modulation modes. The memory 1321 is divided into the three patterns above (having bandwidths respectively being two times, four times and eight times of the size of cells). FIG. 18b shows the number of times of reading/writing the memory 1314 for different LDPC block lengths and different modulation modes (also divided into the three patterns above), and ratios to the number of times of reading/writing of the prior art. The results show that, under the same LDPC block length and the same modulation mode, regardless of the ratio of the bandwidth size to the size of cells, compared to the prior art, the present invention effectively reduces the number of times of accessing (reading/writing) the memory, and such effect is particularly significant as w/c gets larger.

Figure 19:
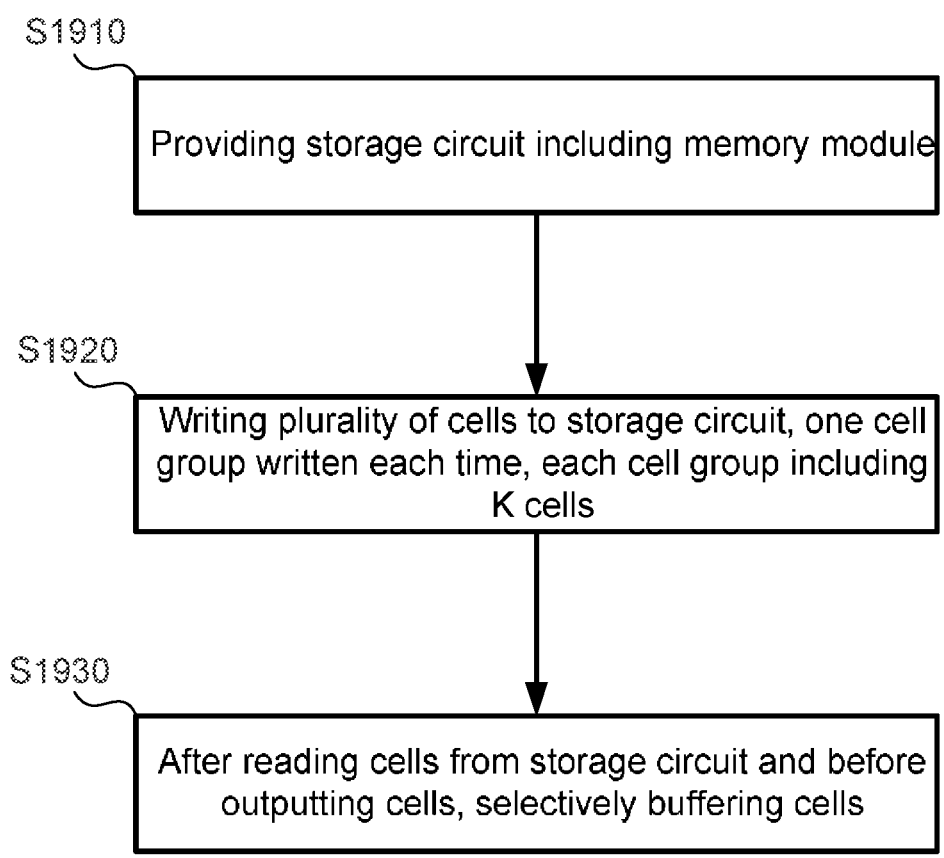
FIG. 19 is a flowchart of a time de-interleaving method according to an embodiment of the present invention.

FIG. 19 shows a flowchart of a time de-interleaving method according to an embodiment of the present invention. In addition to the foregoing time de-interleaving circuit, the present invention correspondingly discloses a time de-interleaving method applied to a signal receiver of a communication system. The method may be performed by the time de-interleaving circuit 700 or an equivalent circuit. As shown in FIG. 19, the time de-interleaving method according to an embodiment of the present invention includes following steps.

In step S1910, a storage circuit is provided. The storage circuit includes a memory module. Reading/Writing operations of the memory module are performed in a unit of one word that includes K cells, where K is a positive integer greater than 1. For example but not limited to, K may be the foregoing exemplary values 2, 4 and 8.

In step S1920, a plurality of cells are written into the storage circuit, with one cell group written each time. The size of one cell group is the size of one word. Taking FIG. 8a for example, the cell group written each time includes four cells.

In step S1930, after reading the cells from the storage circuit and before outputting the cells, the cells are selectively buffered. The data amount of one cell group is read each time. In order to output the cells according to the time de-interleaved sequence, several cells read from the storage circuit each time are buffered for later use instead of being immediately outputted, hence reducing the number of times of accessing the memory module.

When the cells of the cell group are buffered in step S1930, one of the cells may be selected and outputted, whereas the remaining (K−1) cells are buffered, as shown in FIG. 8b. As shown in FIG. 8b, FIG. 9c, FIG. 10c and FIG. 11c, after the storage circuit successively outputs Nr cells, Nr×(K−1) buffered cells are next successively outputted. In practice, in different embodiments, in step S1930, each time after one cell group is read, all of the cells may be buffered instead of being immediately outputted, and all of the buffered cells are successively outputted after Nr cell groups are buffered (corresponding to the size of the memory 721 in FIG. 8a, FIG. 9c, FIG. 10c and FIG. 11c respectively adjusted to 8×4, 8×4, 8×2 and 8×8).

Figure 20:
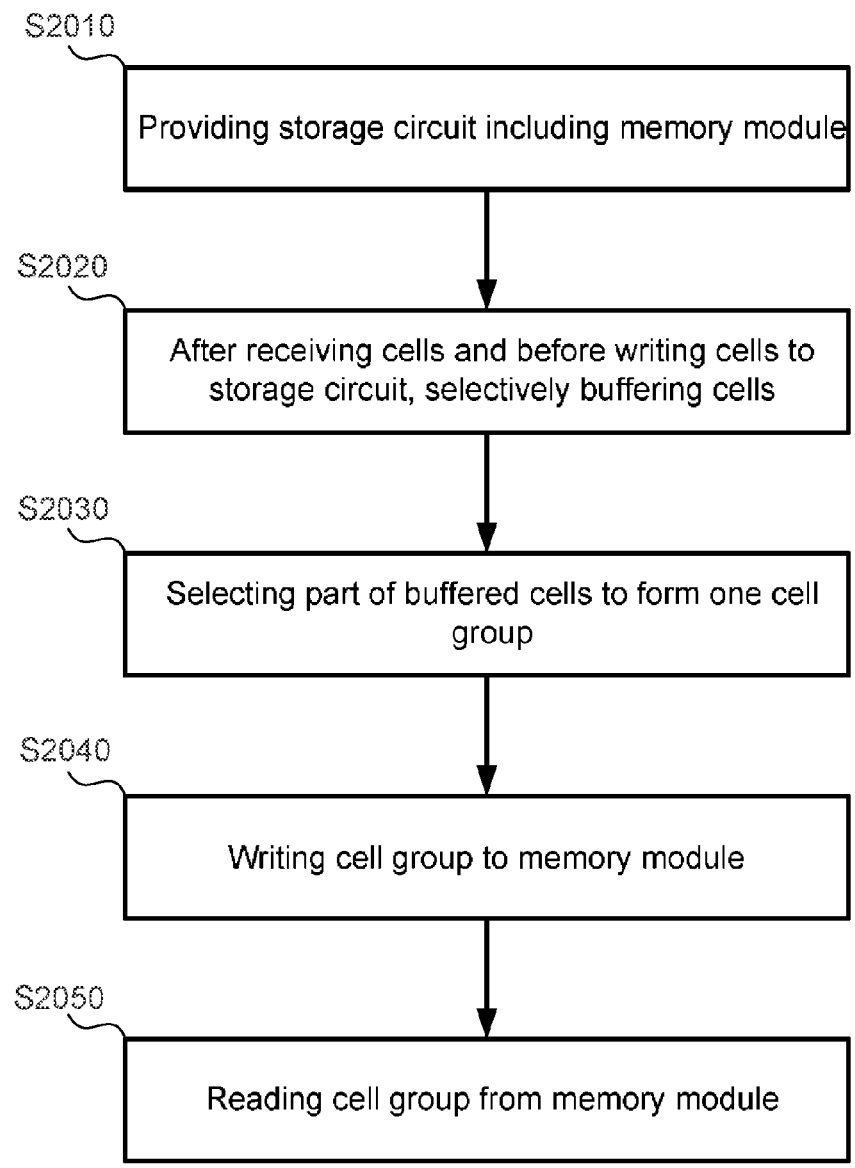
FIG. 20 is a flowchart of a time de-interleaving method according to another embodiment of the present invention.

FIG. 20 shows a flowchart of a time de-interleaving method according to another embodiment of the present invention. The method may be performed by the time de-interleaving circuit 1300 or an equivalent circuit. As shown in FIG. 20, the time de-interleaving method according to an embodiment of the present invention includes following steps.

In step S2010, a storage circuit is provided. The storage circuit includes a memory module. Reading/Writing operations of the memory module are performed in a unit of one word that includes K cells, where K is a positive integer greater than 1. For example but not limited to, K may be the foregoing exemplary values 2, 4 and 8.

In step S2020, after receiving the cells and before writing the cells into the storage circuit, the cells are selectively buffered. In order to have the cells of the cell group read each time in the subsequent reading process satisfy the time de-interleaving sequence, before the received cells are written into the storage circuit, a part of the cells need to be buffered to adjust the sequence of writing the cells into the storage circuit. As shown in FIG. 14a, FIG. 15a, FIG. 16a and FIG. 17a, there are a total of successive Nc×(K−1) cells buffered.

In step S2030, a part of the buffered cells are selected to form a cell group. After Nc×(K−1) cells are buffered, (K−1) cells are selected from the buffered cells to form a cell group with a newly received cell each time the new cell is received.

In step S2040, the cell group is written into the storage circuit. The size of one cell group is the size of one word of the memory module. Taking FIG. 14a for example, the cell group written each time includes four cells.

In step S2050, the cell group is read from the storage circuit. One cell group is read each time in a reading operation. As the sequences of the cells of each cell group are already adjusted before the cells are written into the storage circuit, the sequences of the cells read out are the sequences of the time de-interleaved cells.

In step S2020, Nc×(K−1) cells may be successively buffered when the cells of the cell group are buffered, as shown in FIG. 14a. Further, as shown in FIG. 14a, FIG. 15a, FIG. 16a and FIG. 17a, after Nc×(K−1) cells are successively buffered, (K−1) buffered cells are outputted to form one cell group with a newly received cell each time the new cell is received. In practice, in different embodiments, in step S2020, Nc×K cells may be successively buffered (corresponding to the size of the memory 1321 in FIG. 14a, FIG. 15a, FIG. 16a and FIG. 17a respectively adjusted to 20×4, 8×4, 8×2 and 8×8), and Nc cell groups are then successively outputted to the storage circuit.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A time de-interleaving circuit, located in a signal receiver of a communication system, performing a time de-interleaving process on an interleaved signal comprising a plurality of cells, the time de-interleaving circuit comprising:

a memory module, storing the cells of the interleaved signal, the cells of the interleaved signal forming a plurality of cell groups each comprising K cells, where K is a positive integer greater than 1, the memory module accessed in a unit of one cell group;

a buffering memory module, buffering only a part of the K cells of one of the cell groups from the memory module to arrange an output sequence of the K cells of the one of the cell groups when the memory module outputs the one of the cell groups; and a selection unit, selecting an output of one of the memory module and the buffering memory module as an output of the time de-interleaving circuit, wherein, when the memory module outputs the one of the cell groups, one cell in the outputted cell group is directly outputted by the selection unit, and the remaining (K−1) cells are buffered in the buffering memory module.

2. The time de-interleaving circuit according to claim 1, wherein in the time de-interleaving process, for the same cell group, the memory module is read once and written once.

3. The time de-interleaving circuit according to claim 1, wherein the memory module is a dynamic random access memory (DRAM), and the buffering memory module is a static random access memory (SRAM).

4. The time de-interleaving circuit according to claim 1, wherein the interleaved signal comprises a plurality of forward error correction (FEC) blocks, each of the FEC blocks comprises N cells, where N is a positive integer greater than 1, and a size of the buffering memory module has a ratio to N×(K−1).

5. The time de-interleaving circuit according to claim 4, wherein after the selection unit successively outputs $$\frac{N}{5}$$

cells from the memory module, the selection unit successively outputs $$\frac{N(K-1)}{5}$$

from the buffering memory module.

6. A time de-interleaving circuit, located in a signal receiver of a communication system, performing a time de-interleaving process on an interleaved signal comprising a plurality of cells, the time de-interleaving circuit comprising:

a memory module, storing the cells of the interleaved signal, the cells of the interleaved signal forming a plurality of cell groups each comprising K cells, wherein K is a positive integer greater than 1, the memory module accessed in a unit of one cell group;

a buffering memory module, buffering only a part of the K cells of one of the cell groups to be written to the memory module to arrange a sequence for writing the K cells of the one of the cell groups into the memory module when the one of the cell groups is inputted to the memory module; and a selection unit, selectively directly writing the K cells of the one of the cell groups to the memory module or buffering the K cells of the one of the cell groups to the buffering module, wherein when the one of the cell groups is inputted to the memory module, one cell in the inputted cell group is directly outputted to the memory module by the selection unit, and the remaining (K−1) cells are buffered in the buffering memory module.

7. The time de-interleaving circuit according to claim 6, wherein in the time de-interleaving process, for the same cell group, the memory module is read once and written once.

8. The time de-interleaving circuit according to claim 6, wherein the memory module is a DRAM, and the buffering memory module is an SRAM.

* * * * *